(12) United States Patent
Mazzillo et al.

(10) Patent No.: US 11,670,730 B2
(45) Date of Patent: *Jun. 6, 2023

(54) AVALANCHE PHOTODIODE FOR DETECTING ULTRAVIOLET RADIATION AND MANUFACTURING METHOD THEREOF

(71) Applicant: STMICROELECTRONICS S.R.L., Agrate Brianza (IT)

(72) Inventors: Massimo Cataldo Mazzillo, Corato (IT); Antonella Sciuto, S. Giovanni la Punta (IT); Dario Sutera, San Gregorio di Catania (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 445 days.

This patent is subject to a terminal disclaimer.

(21) Appl. No.: 16/573,941

(22) Filed: Sep. 17, 2019

(65) Prior Publication Data
US 2020/0013915 A1 Jan. 9, 2020

Related U.S. Application Data

(63) Continuation of application No. 15/140,880, filed on Apr. 28, 2016, now Pat. No. 10,461,209.

(30) Foreign Application Priority Data

Oct. 6, 2015 (IT) .................. 102015000058764

(51) Int. Cl.
*H01L 31/107* (2006.01)
*H01L 31/0224* (2006.01)
*H01L 31/18* (2006.01)

(52) U.S. Cl.
CPC .... *H01L 31/107* (2013.01); *H01L 31/022416* (2013.01); *H01L 31/18* (2013.01)

(58) Field of Classification Search
CPC .................. H01L 31/022416; H01L 31/107
USPC .................. 250/370.14; 257/72, 437, 438
See application file for complete search history.

(56) References Cited

U.S. PATENT DOCUMENTS

| 5,491,339 A | 2/1996 | Mitsui et al. |
| 5,596,186 A | 1/1997 | Kobayashi |
| 2009/0184384 A1 | 7/2009 | Sanfilippo et al. |

(Continued)

FOREIGN PATENT DOCUMENTS

CN 103208555 A 7/2013

OTHER PUBLICATIONS

Honeywell International Inc., "C7027A, C7035A, C7044A, C7927A—Minipeeper® Ultraviolet Flame Detectors," Informational Pamphlet, 60-2026-14, 2011, 12 pages.

(Continued)

*Primary Examiner* — David P Porta
*Assistant Examiner* — Carolyn Fin
(74) *Attorney, Agent, or Firm* — Seed IP Law Group LLP

(57) ABSTRACT

An avalanche photodiode for detecting ultraviolet radiation, including: a silicon carbide body having a first type of conductivity, which is delimited by a front surface and forms a cathode region; an anode region having a second type of conductivity, which extends into the body starting from the front surface and contacts the cathode region; and a guard ring having the second type of conductivity, which extends into the body starting from the front surface and surrounds the anode region.

24 Claims, 18 Drawing Sheets

(56) References Cited

U.S. PATENT DOCUMENTS

2011/0024768 A1    2/2011  Veliadis

OTHER PUBLICATIONS

Liu et al., "Double Mesa Sidewall Silicon Carbide Avalanche Photodiode," *IEEE Journal of Quantum Electronics* 45(12):1524-1528, 2009.
Razeghi et al., "Semiconductor ultraviolet detectors," *J. Appl. Phys.* 79(10):7433-7473, 1996.
Vert et al., "Solar-Blind 4H-SiC Single-Photon Avalanche Diode Operating in Geiger Mode," *IEEE Photonics Technology Letters* 20(18):1587-1589, 2008.
Zhou et al., "High-Temperature Single Photon Detection Performance of 4H-SiC Avalanche Photodiodes," *IEEE Photonics Technology Letters* 26(11):1136-1138, 2014.

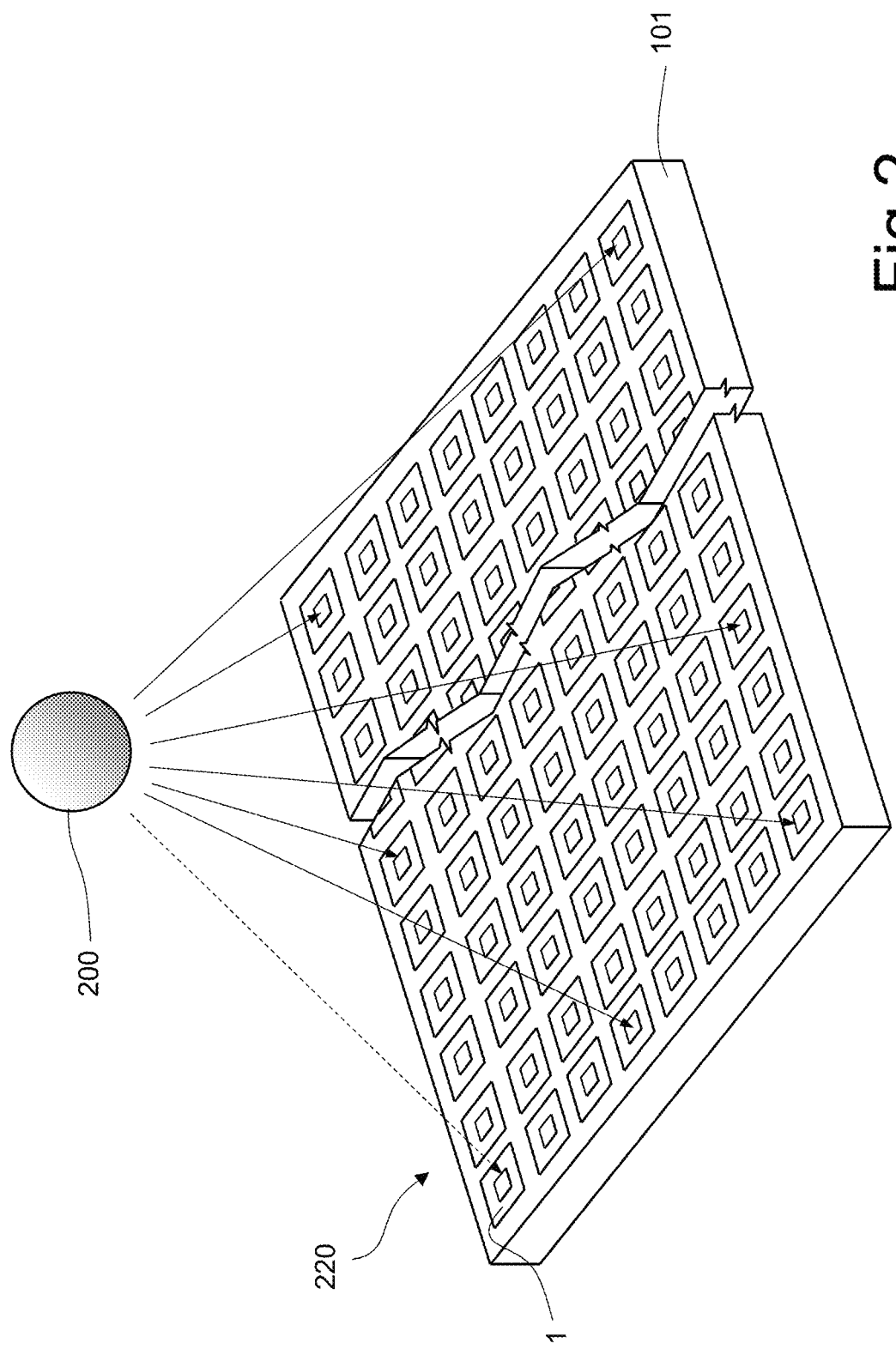

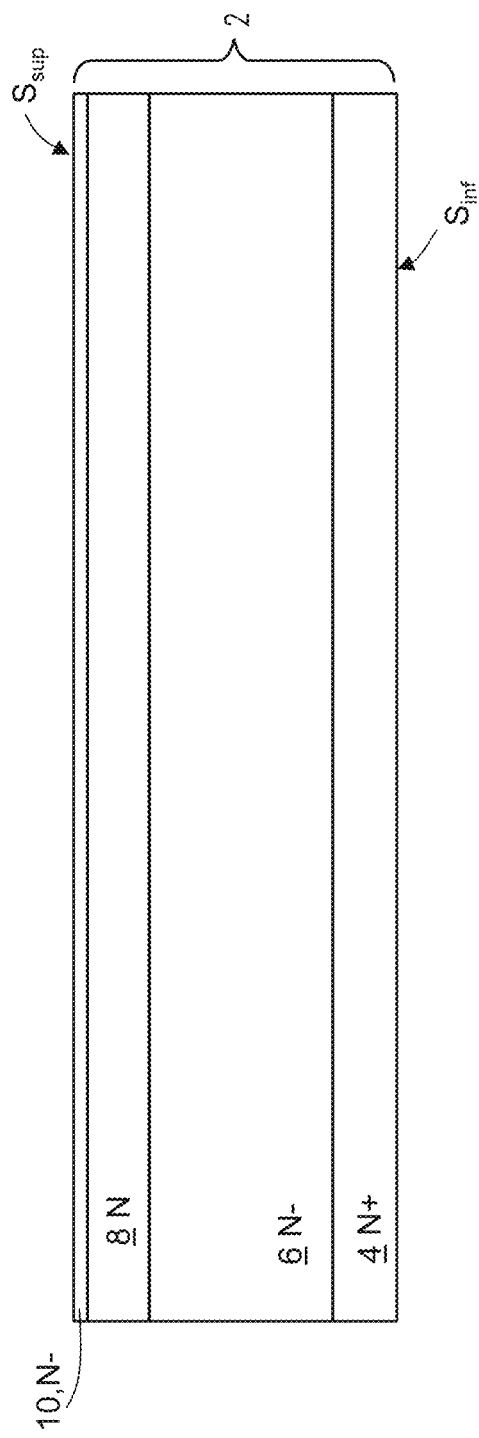
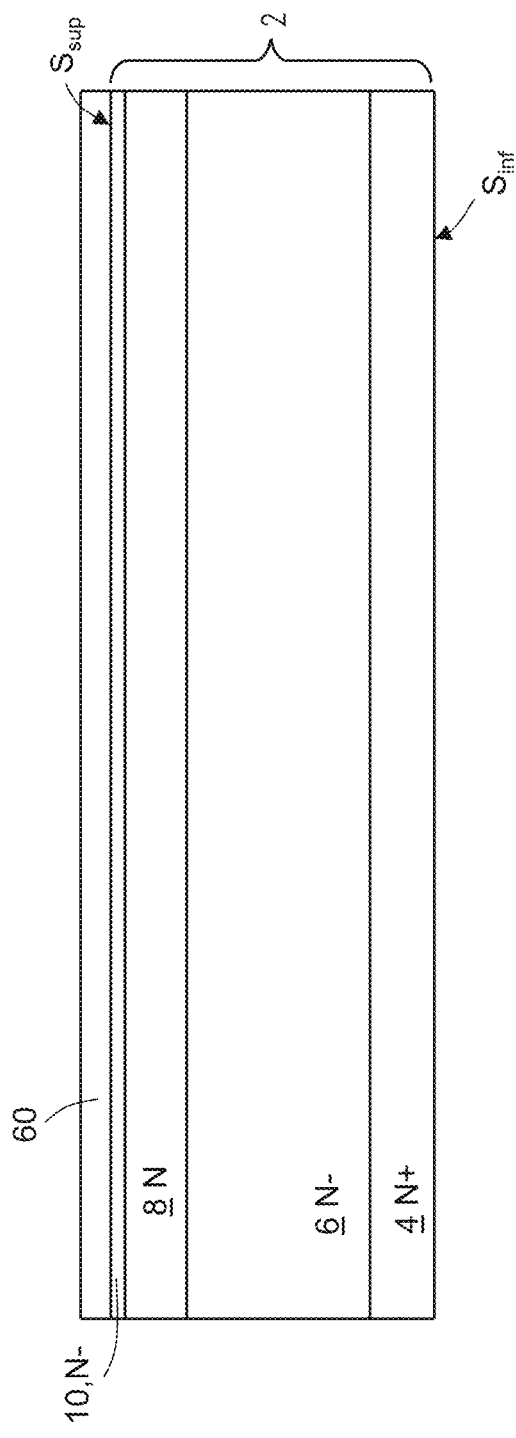

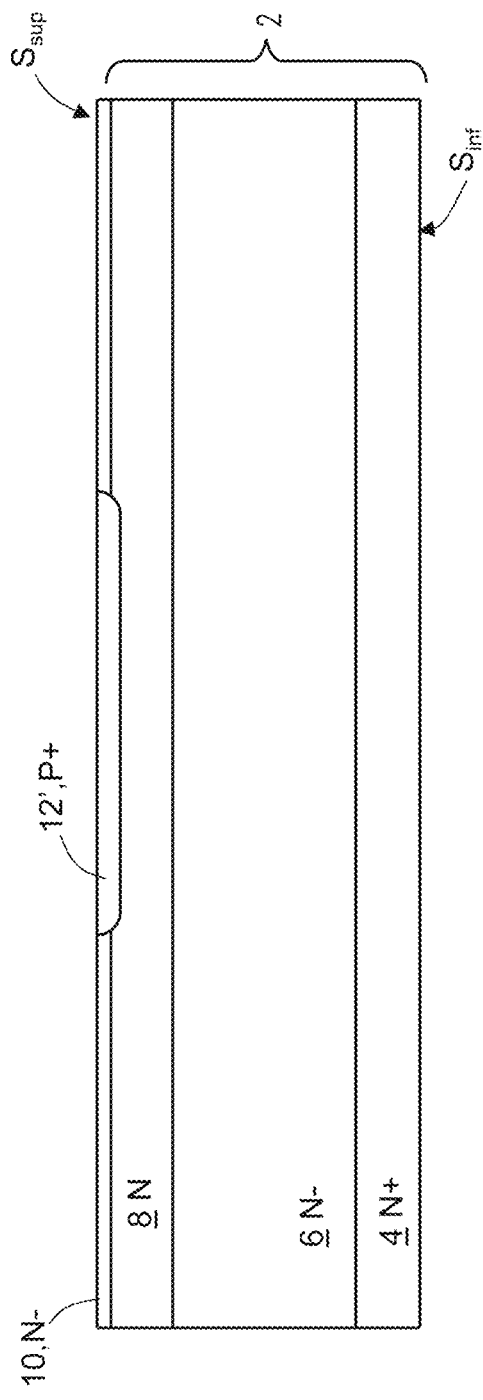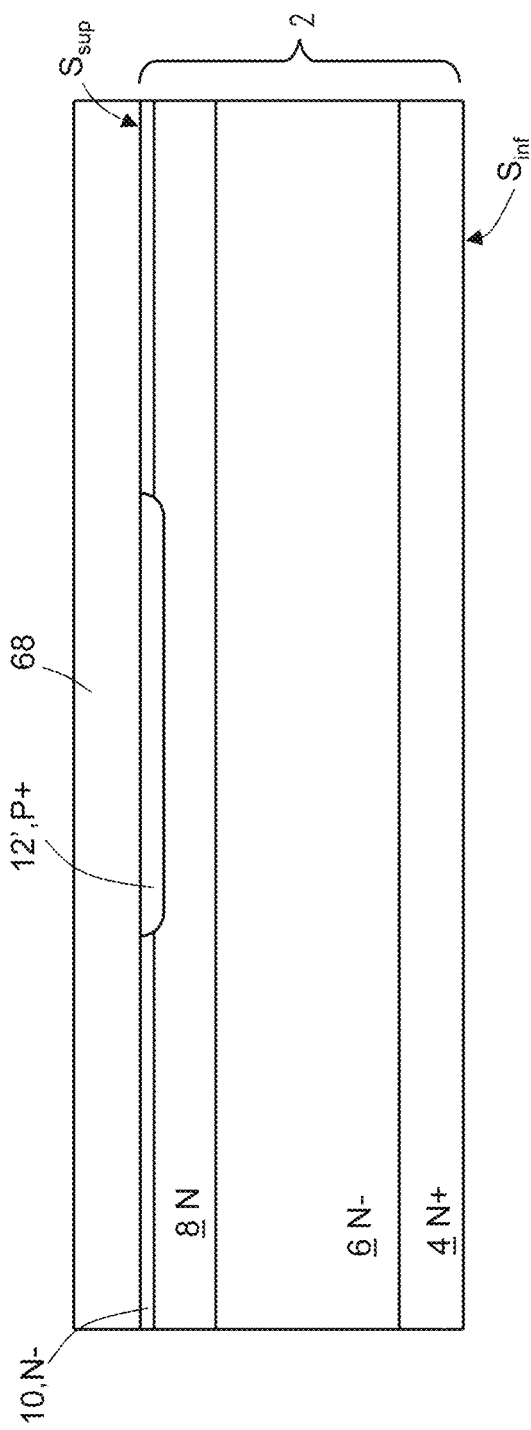

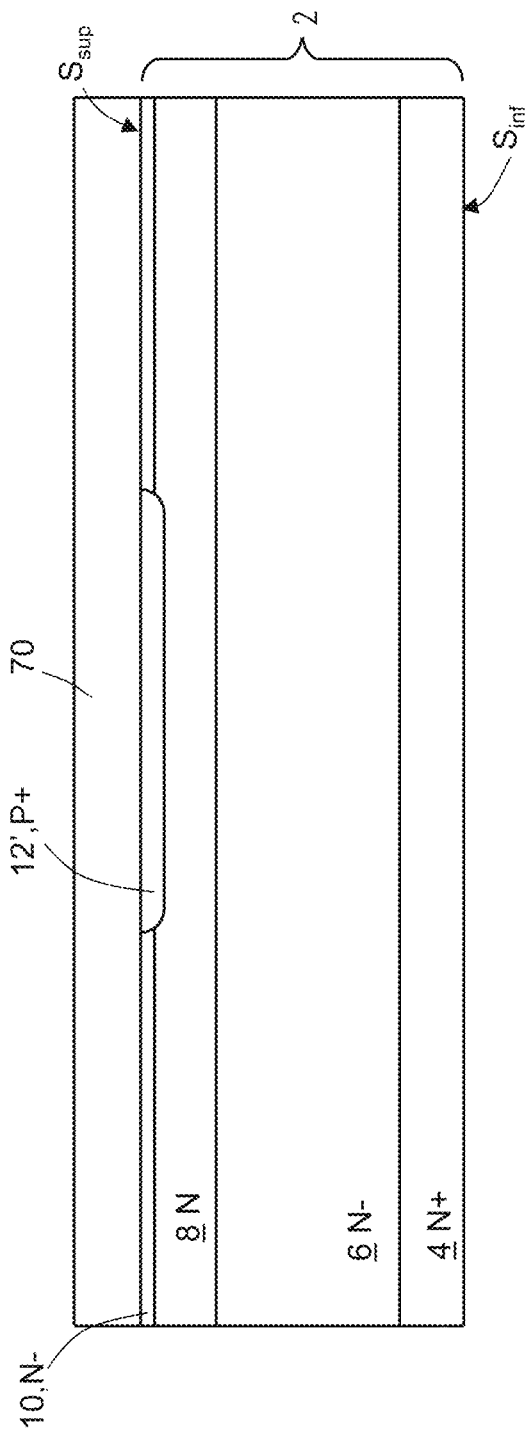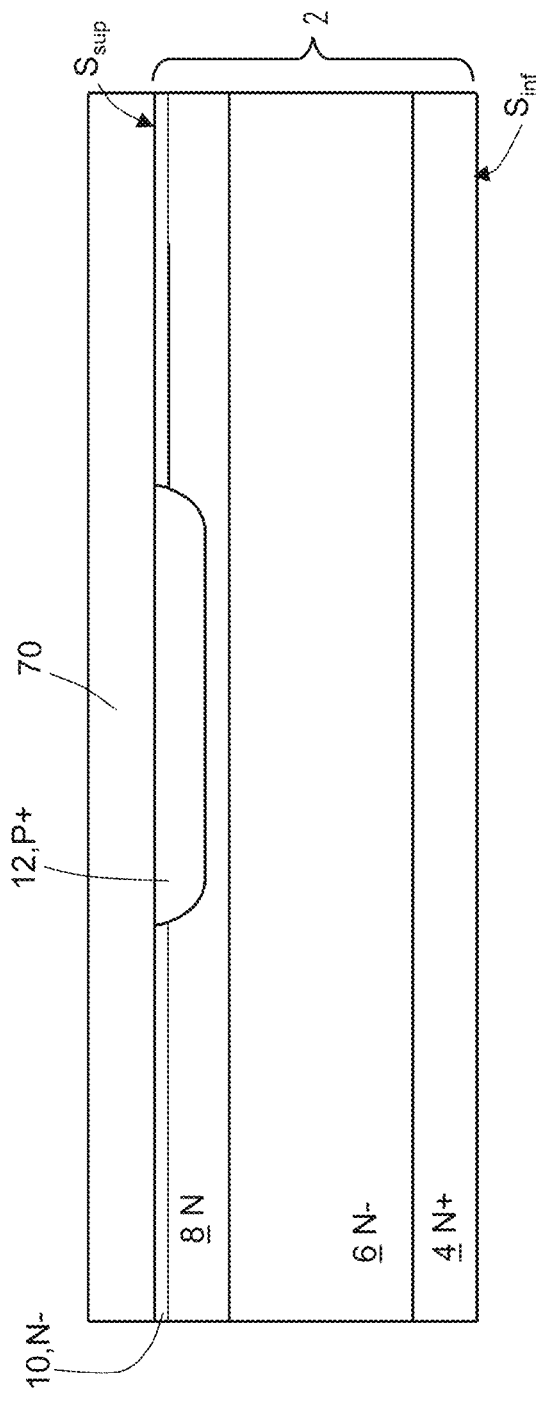

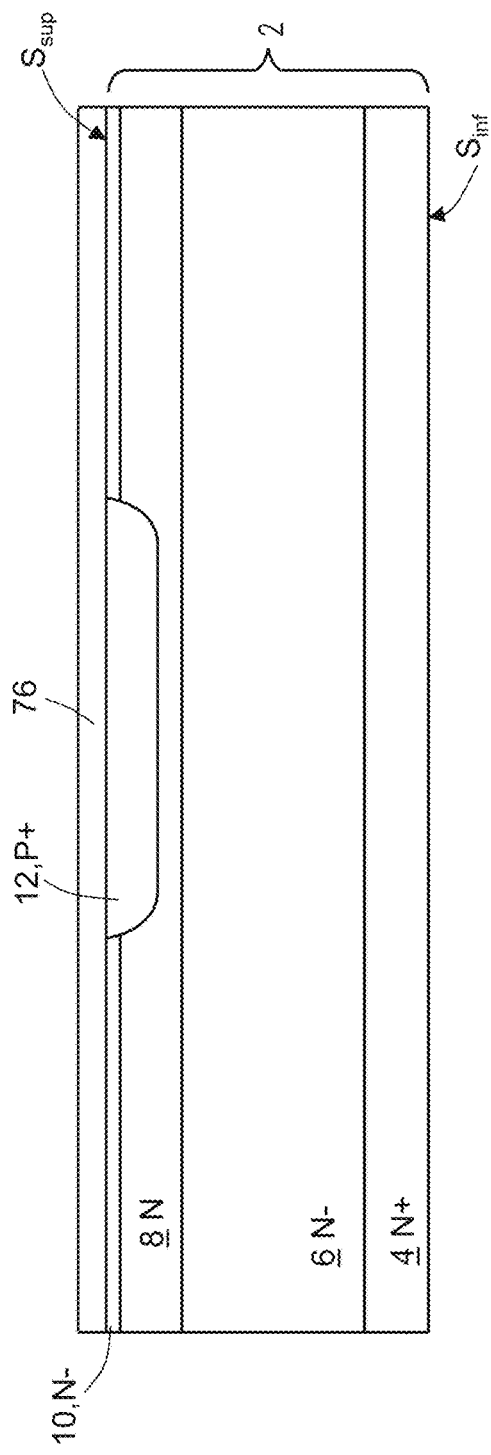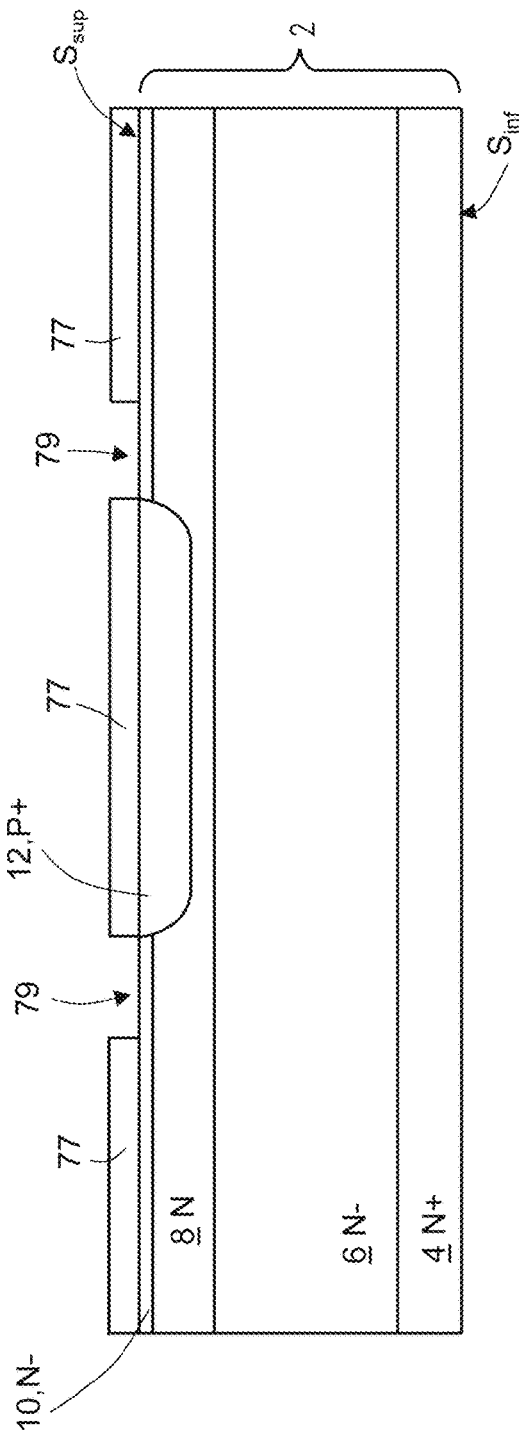

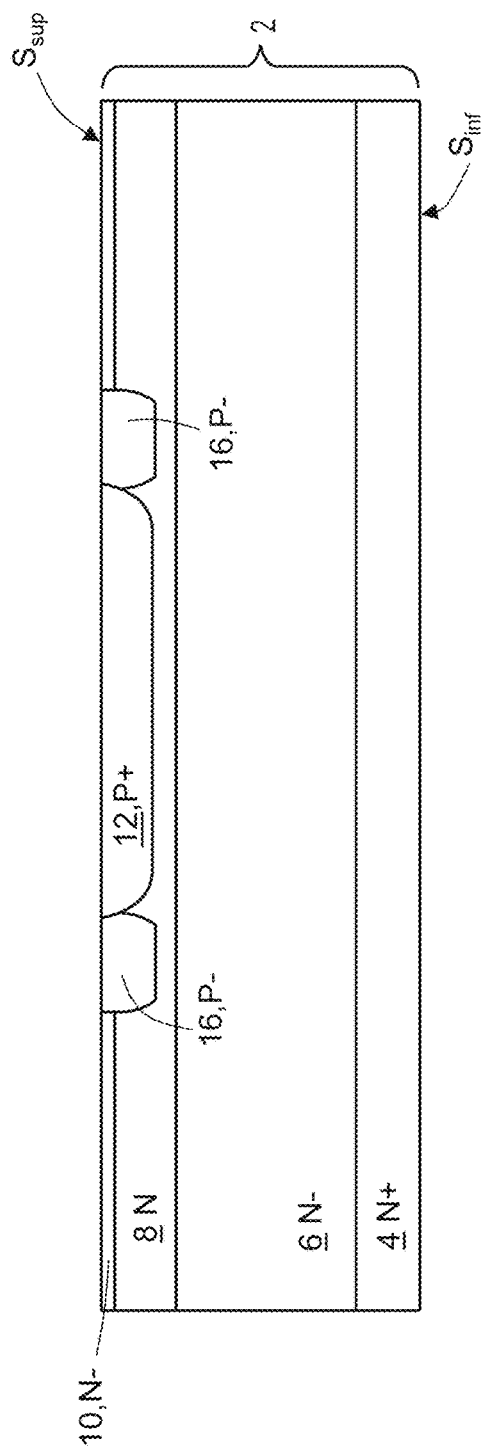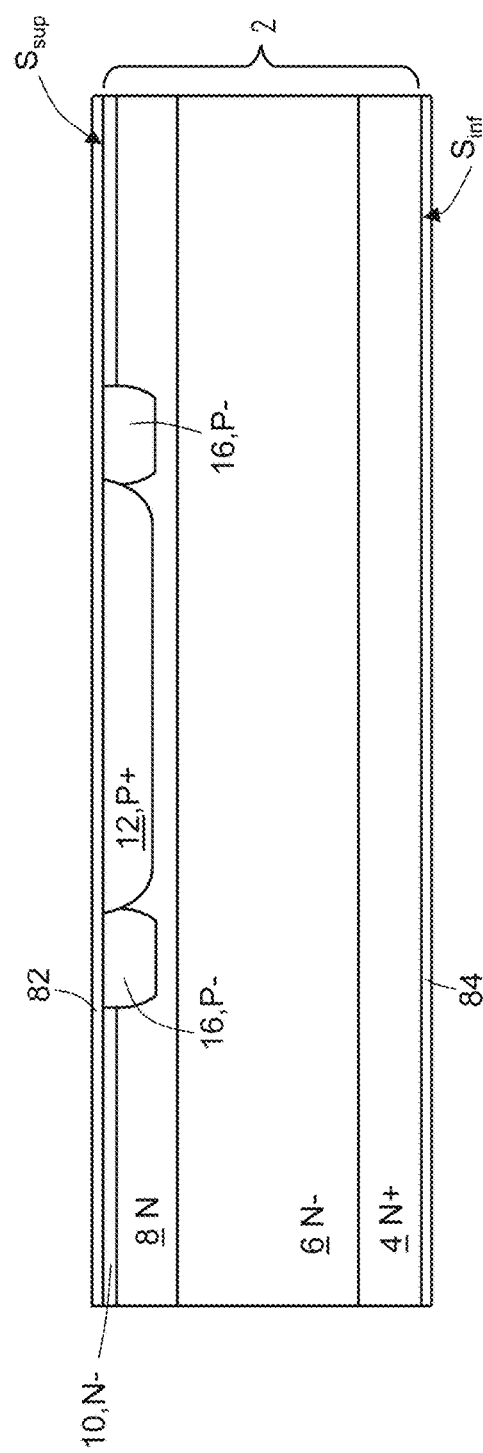

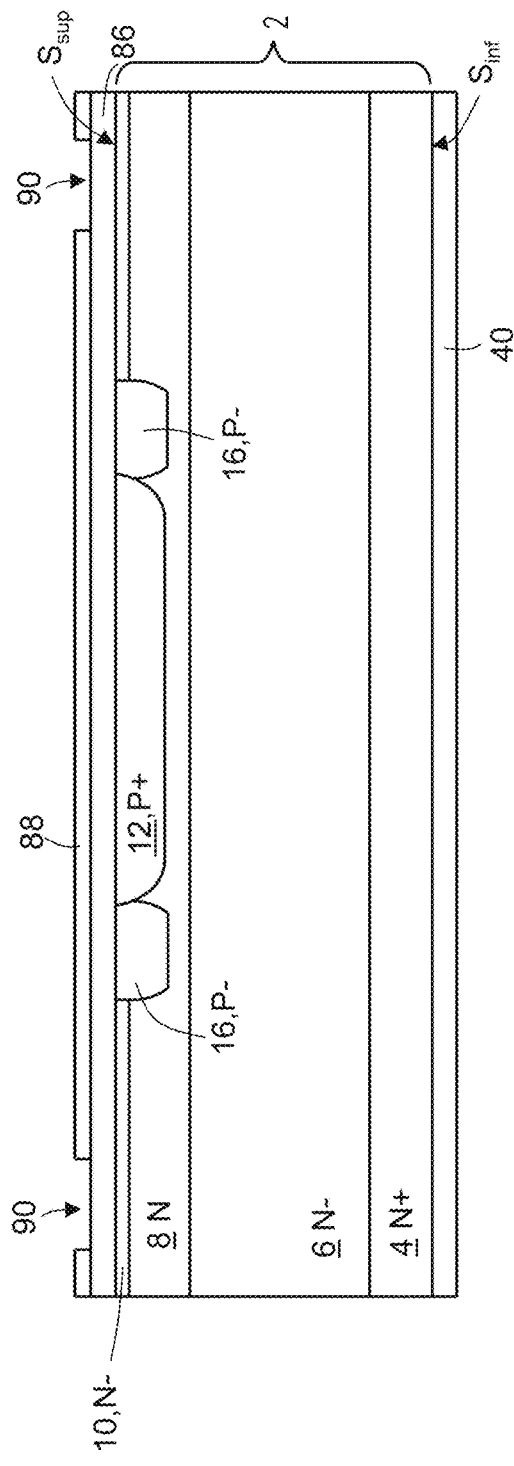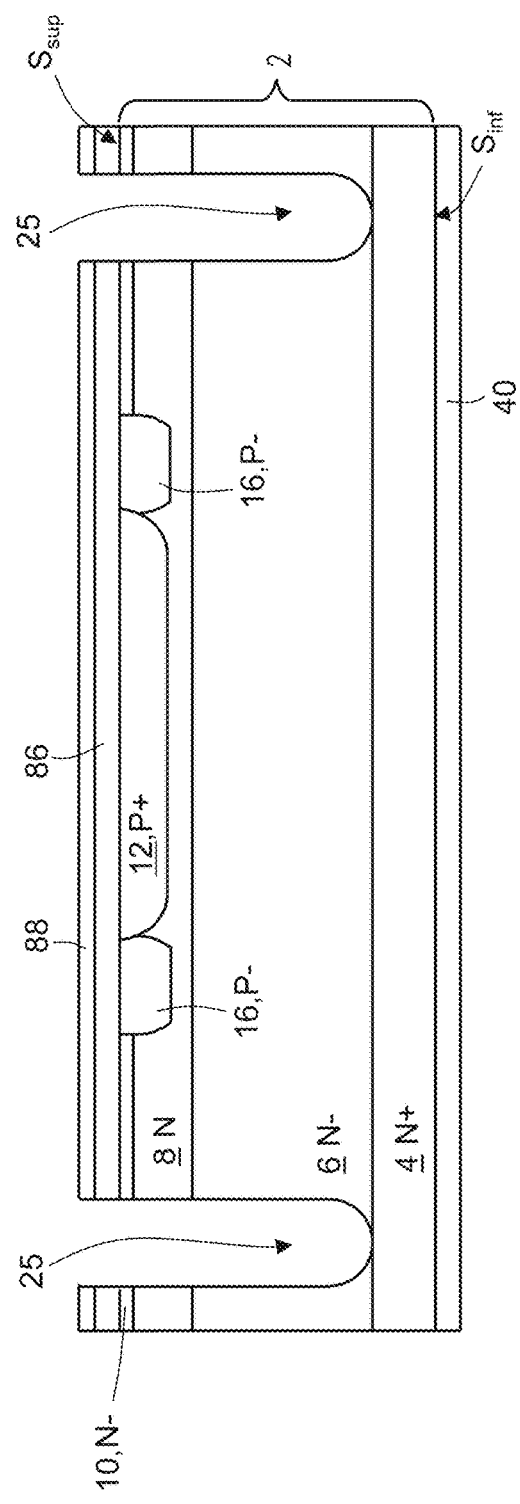

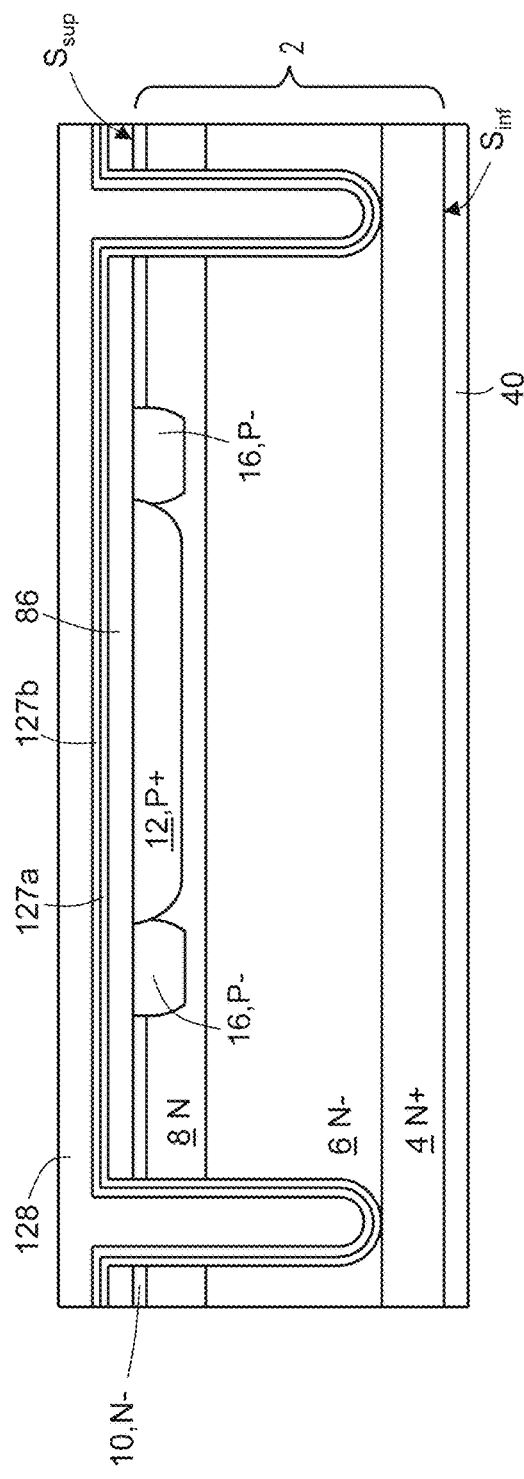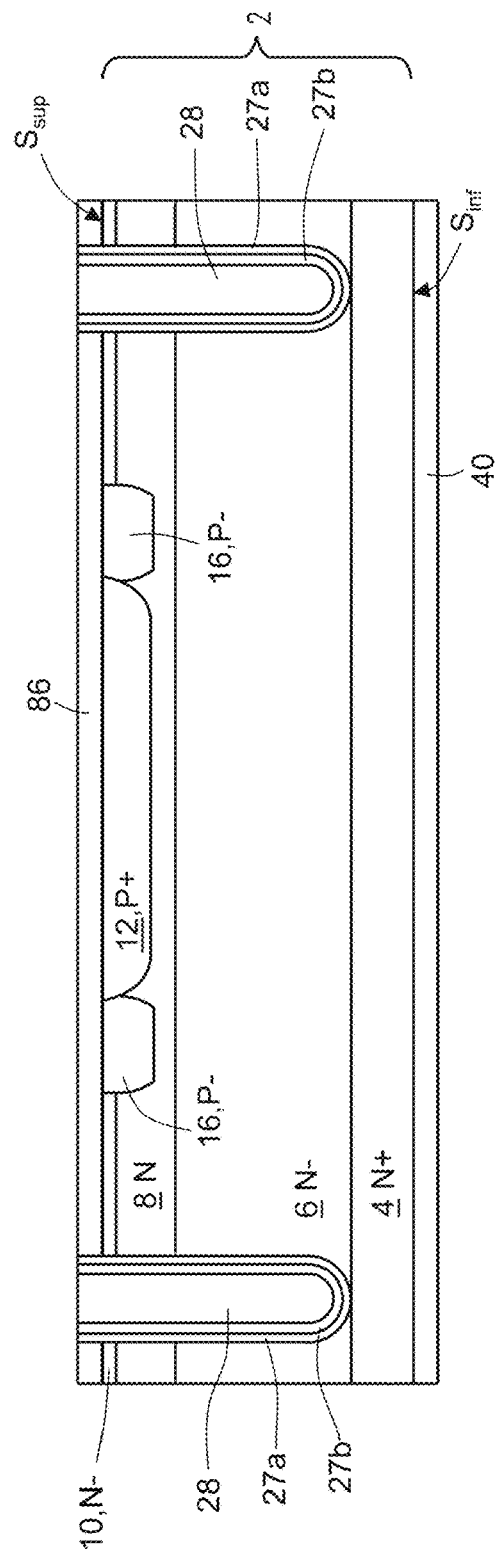

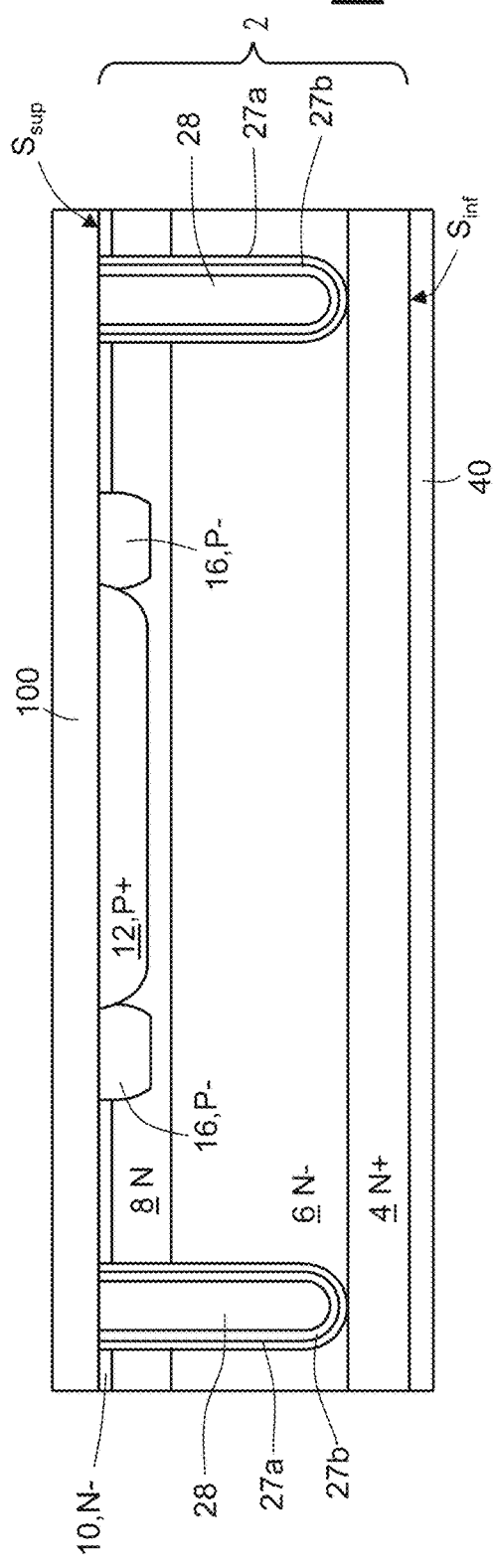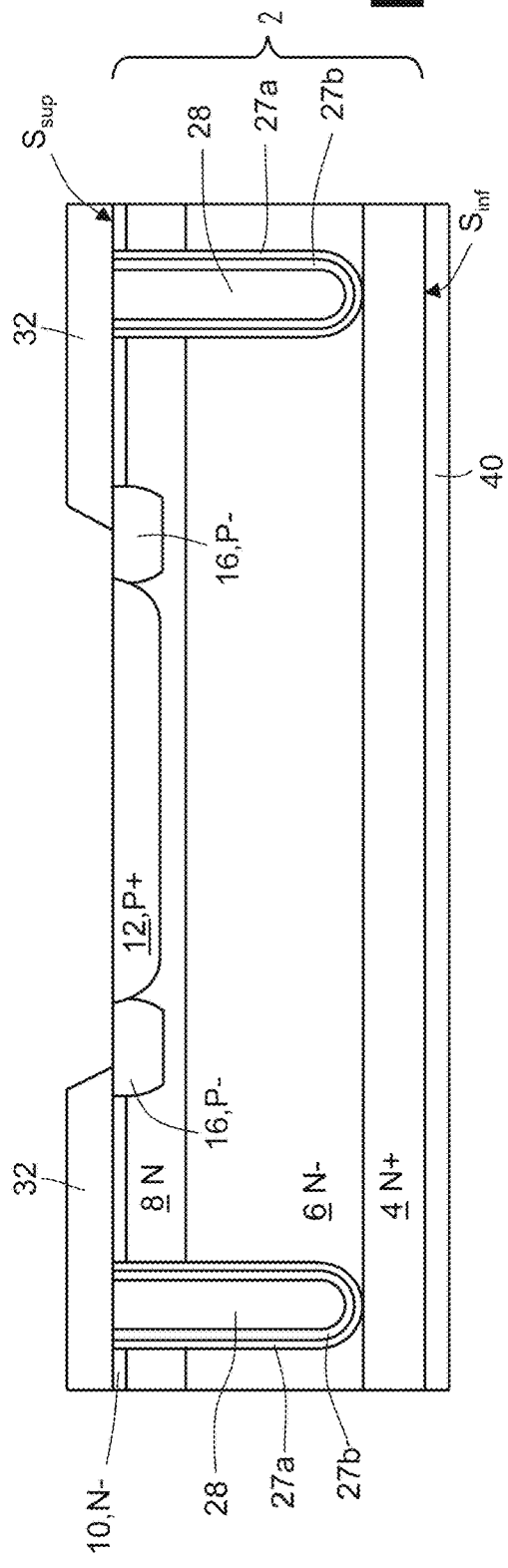

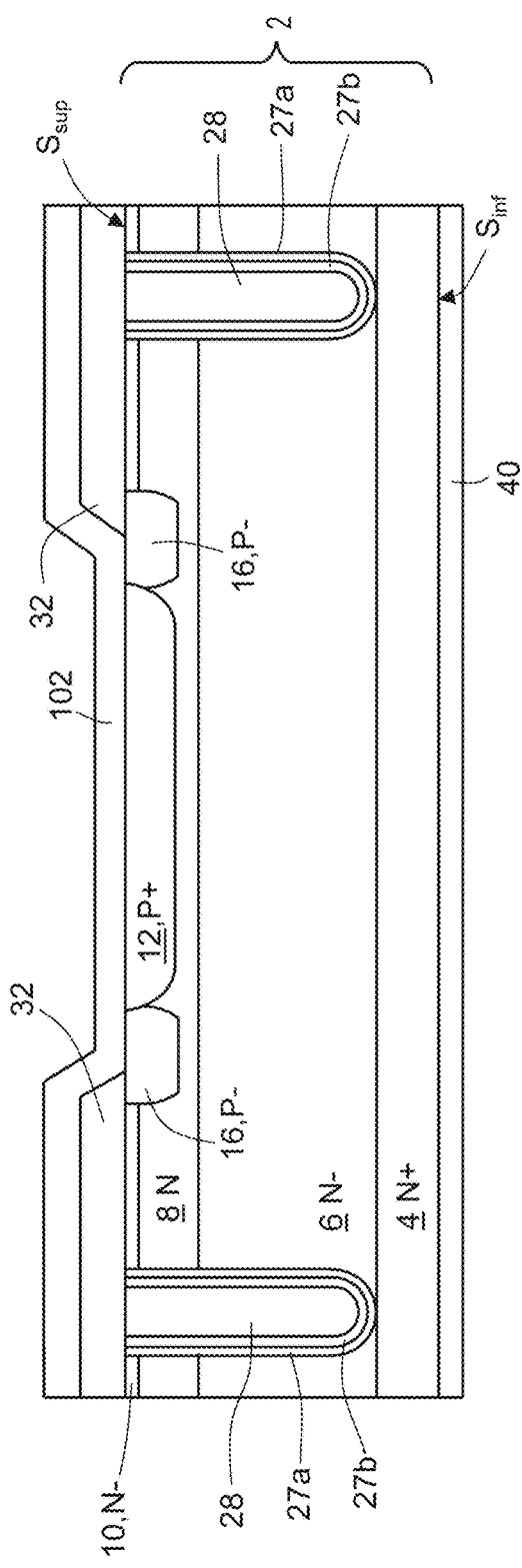
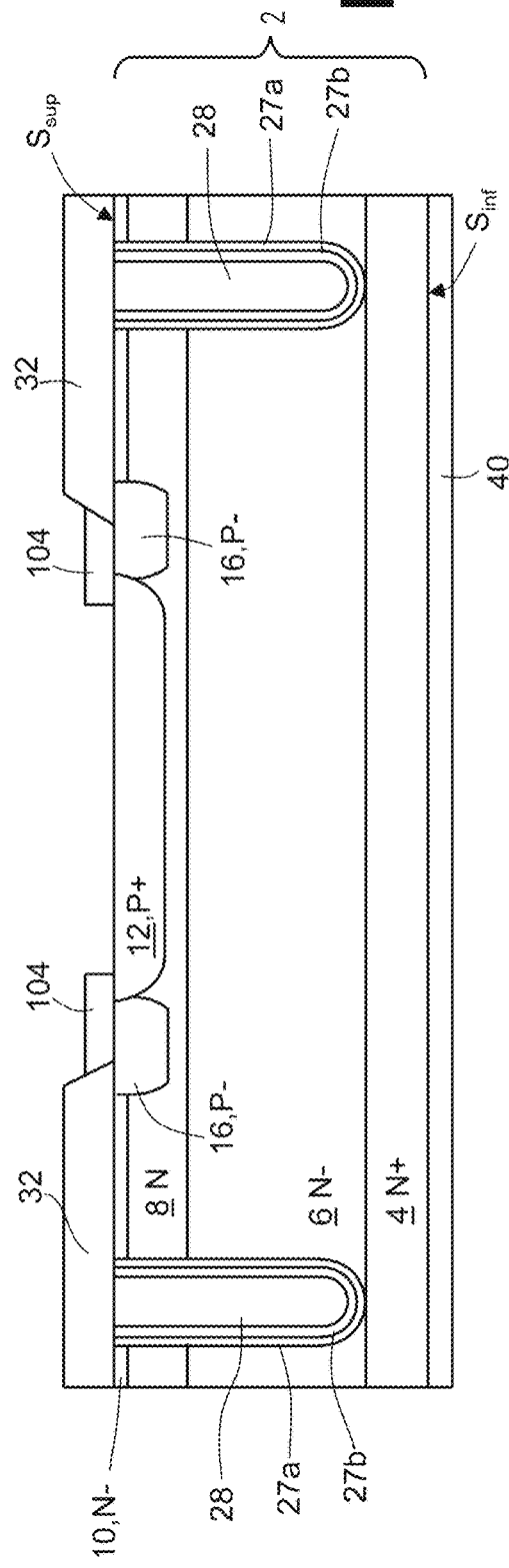

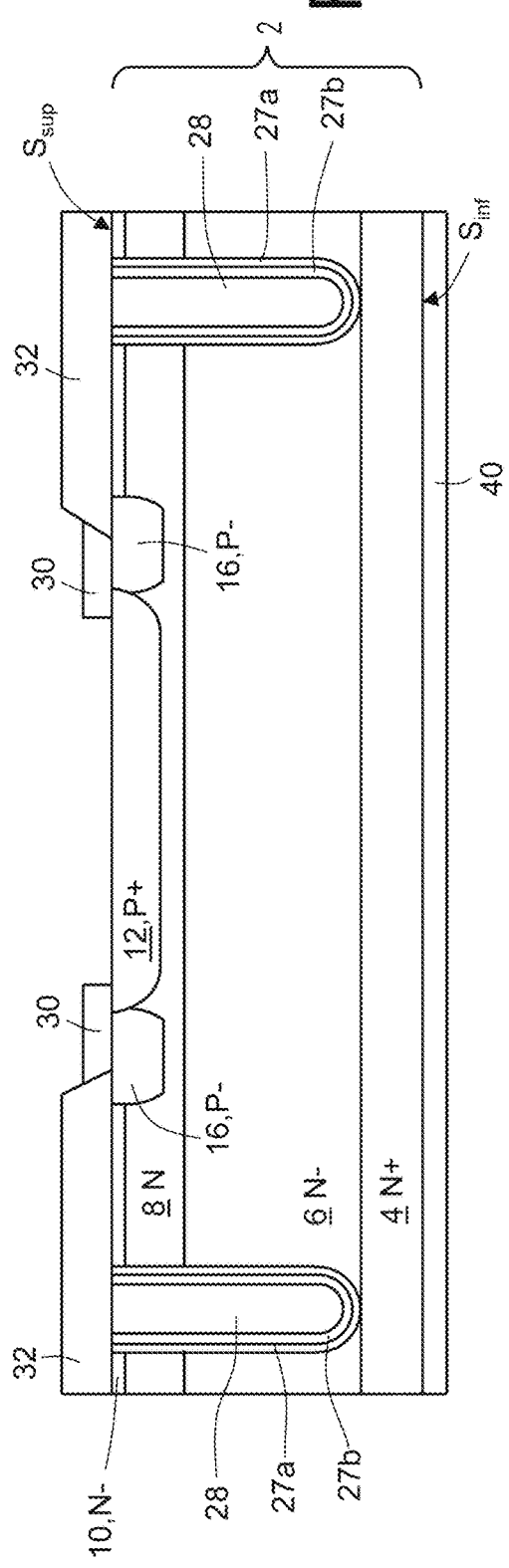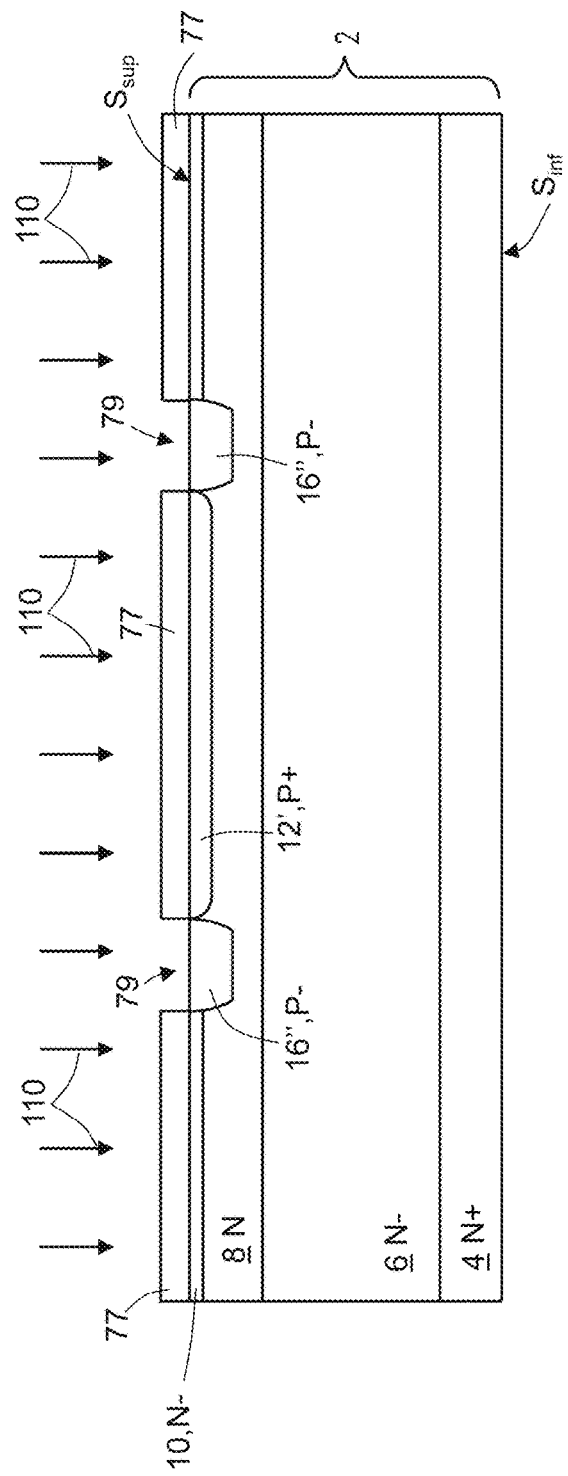

AVALANCHE PHOTODIODE FOR DETECTING ULTRAVIOLET RADIATION AND MANUFACTURING METHOD THEREOF

BACKGROUND

Technical Field

The present disclosure relates to an avalanche photodiode for detecting ultraviolet radiation and to the corresponding manufacturing method.

Description of the Related Art

As is known, in the technical field of photon detection, there is felt the need to have devices that enable detection of ultraviolet electromagnetic radiation with high sensitivity, and are thus able to detect an even limited number of ultraviolet photons. In this connection, the spectral region of ultraviolet radiation is comprised between 100 nm and 400 nm.

By way of example, the paper "High-Temperature Single Photon Detection Performance of 4H—SiC Avalanche Photodiodes", by Dong Zhou et al., IEEE Photonics Technology Letters, vol. 26, no. 11, Jun. 1, 2014, describes a silicon carbide photodiode, in which lateral confinement of the electrical field is obtained by adopting a structure of the so-called "bevelled mesa" type. This photodiode is characterized by low dark current, thanks to the low thermal generation within silicon carbide. Further, this photodiode is particularly suitable for detecting ultraviolet radiation, since it exhibits an intrinsic insensitivity in the visible. However, implementation of a mesa structure entails impossibility of obtaining, for example, a high-fill-factor detector.

BRIEF SUMMARY

One or more embodiments of the present disclosure provide a silicon carbide avalanche photodiode and a manufacturing process that will enable the drawbacks of the known art to be overcome at least in part.

According to one or more embodiments of the disclosure, an avalanche photodiode for detecting ultraviolet radiation includes a semiconductor body, an anode region, and a guard ring. The semiconductor body has a first type of conductivity, is delimited by a front surface, and forms a cathode region. The anode region has a second type of conductivity, extends into said body starting from the front surface, and contacts the cathode region. The guard ring has the second type of conductivity, extends into said body starting from the front surface, and completely laterally surrounds the anode region.

BRIEF DESCRIPTION OF THE SEVERAL VIEWS OF THE DRAWINGS

For a better understanding of the disclosure, embodiments thereof are now described purely by way of non-limiting example and with reference to the attached drawings, wherein:

FIG. 2 is a schematic perspective view of a photodiode array;

FIGS. 3-29 (not in scale) are schematic cross-sections of an embodiment of the present photodiode during successive steps of a manufacturing method;

FIGS. 30-32 (not in scale) are schematic cross-sections of an embodiment of the present photodiode during successive steps of a manufacturing method.

DETAILED DESCRIPTION

Figure 1:
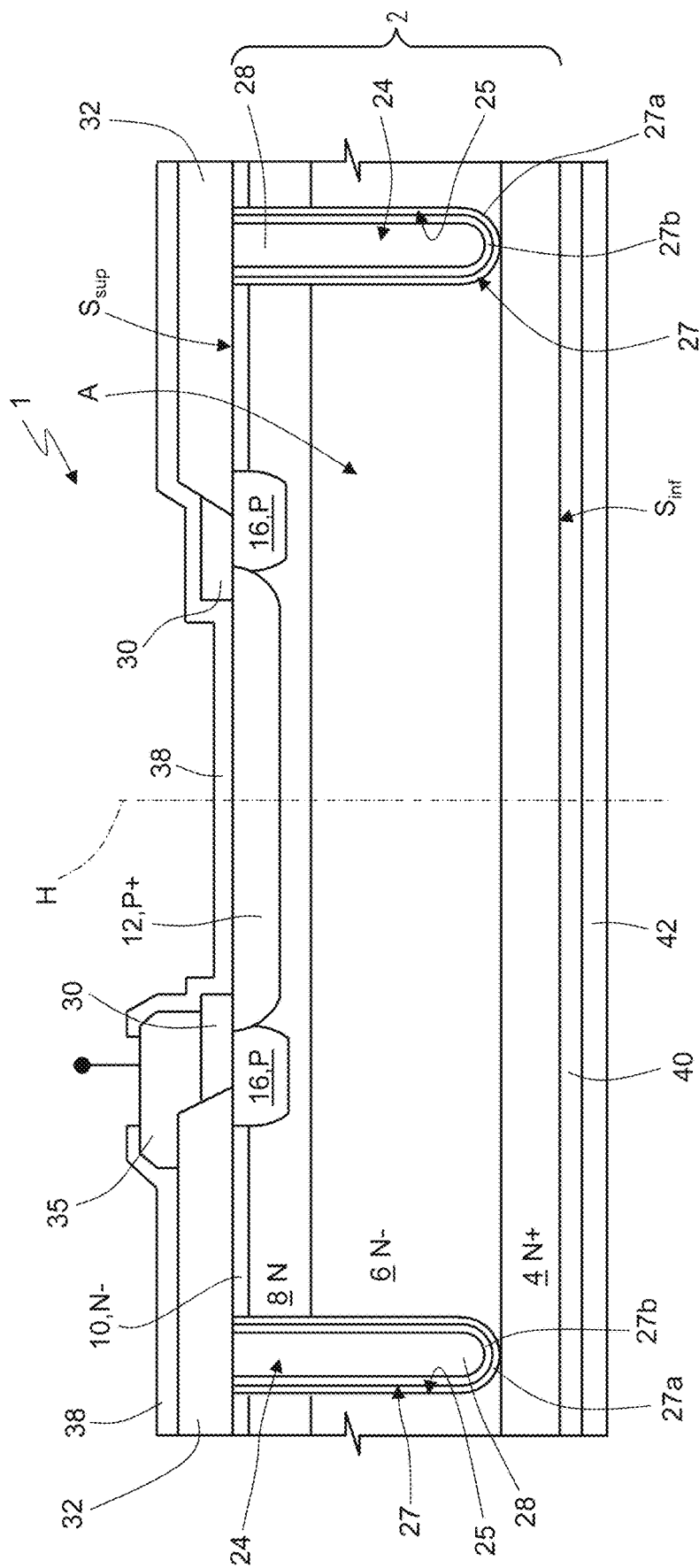
FIG. 1 (not in scale) is a schematic cross-section of an embodiment of the present photodiode.

FIG. 1 shows an example of embodiment of a photodiode 1 of an avalanche type 1. The photodiode 1 may belong, for example, to a photodiode array 220, as illustrated in FIG. 2, which also shows an external light source 200 designed to emit ultraviolet radiation. The array 220 may comprise, in addition to the photodiode 1, any number of photodiodes, these photodiodes being, for example, the same as the photodiode 1.

Once again with reference to FIG. 1, the photodiode 1 is integrated in a semiconductor chip 101, which forms a semiconductor body 2. In a preferred embodiment, the semiconductor chip 101 is a silicon carbide semiconductor chip. In particular, the semiconductor body 2 may be made of 4H-polytype silicon carbide (4H—SiC).

The semiconductor body 2 includes a substrate 4 of an N+ type, which is delimited at the bottom by a bottom surface $S_{inf}$ and has a thickness of, for example, 350 µm. Further, the substrate 4 is doped, for example, with nitrogen and has a doping level, for example, of $1 \cdot 10^{19}$ cm$^{-3}$.

Further, the semiconductor body 2 comprises a first epitaxial layer 6, a second epitaxial layer 8, and a third epitaxial layer 10.

The first epitaxial layer 6 is arranged on the substrate 4, is of an N− type, has a thickness, for example, comprised between 1 µm and 10 µm, and has a doping level, for example, of $1 \cdot 10^{14}$ cm$^{-3}$, and in any case not higher than $1 \cdot 10^{15}$ cm$^{-3}$.

The second epitaxial layer 8 overlies, in direct contact, the first epitaxial layer 6, is of an N type, has a thickness, for example, comprised between 0.8 µm and 1.2 µm and has a doping level, for example, of $5 \cdot 10^{17}$ cm$^{-3}$.

The third epitaxial layer 10 overlies, in direct contact, the second epitaxial layer 8, is of an N− type, has a thickness, for example, comprised between 0.1 µm and 0.2 µm and has a doping level, for example, of $1 \cdot 10^{14}$ cm$^{-3}$. In a preferred embodiment, the second epitaxial layer 8 has a higher doping level than the doping levels of the first and third epitaxial layers.

The first, second, and third epitaxial layers 6, 8, 10 may be doped, for example, with nitrogen. In addition, the third epitaxial layer 10 forms a top surface $S_{sup}$, which delimits the semiconductor body 2 at the top. In this connection, FIG. 1 further represents an axis H of the semiconductor body 2, which is perpendicular to the bottom surface $S_{inf}$ and to the top surface $S_{sup}$.

An anode region 12, of a P+ type and of a circular or polygonal shape (for example, quadrangular), extends through the third epitaxial layer 10, starting from the top surface $S_{sup}$, as well as within a top portion of the second epitaxial layer 8. In particular, the anode region 12 is doped, for example, with aluminum, has a thickness, for example, comprised between 0.05 µm and 0.25 µm and has a peak doping level, for example, of $5 \cdot 10^{18}$ cm$^{-3}$.

For practical purposes, the anode region 12, the second epitaxial layer 8, and the first epitaxial layer 6 form a PNI junction, because the electrical behavior of the first epitaxial layer 6 may be considered equivalent to that of an intrinsic layer. The second epitaxial layer 8 thus functions as cathode region. The PNI junction is designed to receive photons and to generate the avalanche current, as described in detail hereinafter.

In greater detail, the PNI junction is such that, in use, formed straddling the interface between the anode region 12 and the second epitaxial layer 8 is a depleted region, which, thanks to the doping of the anode region 12, does not extend as far as the top surface $S_{sup}$, nor does it extend into the first epitaxial layer 6. Consequently, the photodiode 1 is characterized by a low breakdown voltage (of the order of a few tens of Volts), without this penalizing the sensitivity of the photodiode 1. In fact, the carriers generated within the first epitaxial layer 6 following upon absorption of photons have long lifetimes, thanks to the low doping of the first epitaxial layer 6, and manage to reach the depleted region, where they may trigger the avalanche.

The photodiode 1 further comprises a guard ring 16 of an annular shape (for example, circular or polygonal) and of a P− type, which extends into the third epitaxial layer 10, starting from the top surface $S_{sup}$, as well as into a top portion of the second epitaxial layer 8. In greater detail, the guard ring 16 completely laterally surrounds the anode region 12, with which it is in direct contact, is doped, for example, with aluminum or boron and has a peak doping level, for example, of $1 \times 10^{18}$ cm$^{-3}$, that is less than the doping level of the anode region 12. Further, without this implying any loss of generality, in the embodiment shown in FIG. 1, the guard ring 16 has a thickness greater than the thickness of the anode region 12, and thus extends to a depth greater than that of the anode region 12.

Operatively, the guard ring 16 forms a PN diode with the second and third epitaxial layers 8, 10 for preventing edge breakdown of the anode region 12.

The photodiode 1 further comprises a lateral isolation region 24, which has, for example, an annular shape (for instance, circular or polygonal) and completely laterally surrounds, at a distance, the ring region 16.

In detail, the lateral isolation region 24 extends in the semiconductor body 2 starting from the top surface $S_{sup}$, passing entirely through the third epitaxial layer 10, the second epitaxial layer 8, and the first epitaxial layer 6, until it contacts the substrate 4. In practice, the portion of semiconductor body 2 that is completely laterally surrounded by the lateral isolation region 24 forms the so-called active area A of the photodiode 1.

In greater detail, the lateral isolation region 24 extends into a corresponding trench 25, which is precisely filled by the lateral isolation region 24. For example, the trench 25 may have a depth comprised between 2 μm and 11 μm and a width comprised between 1 μm and 2 μm.

The lateral isolation region 24 comprises a lateral coating region 27, which is arranged more externally and is in direct contact with the semiconductor body 2. Further, the lateral isolation region 24 comprises a conductive region 28, which is arranged more internally and which will be referred to in what follows as the conductive isolation region 28.

The conductive isolation region 28 is made of conductive material (for example, tungsten or polysilicon) and is surrounded at the bottom and at the sides by the lateral coating region 27, which in turn coats the bottom and the side walls of the trench 25.

As regards the lateral coating region 27, it is formed, for example, by a thin coating layer 27a, which is arranged more externally and is made, for example, of titanium, and by a thick coating layer 27b, which is arranged more internally and is made, for example, of titanium nitride. In practice, the thin coating layer 27a coats the bottom and the side walls of the trench 25.

The thickness of the thin coating layer 27a is, for example, 45 nm, whereas the thickness of the thick coating layer 27b is, for example, 70 nm.

The photodiode 1 further comprises a top conductive region 30, made, for example, of nickel silicide (Ni$_2$Si) and arranged on the top surface $S_{sup}$.

In detail, the top conductive region 30 has, for example, an annular shape and overlies at least part of the guard ring 16 and a peripheral portion of the anode region 12, with which it is in direct contact. Without any loss of generality, it is for example possible for the anode region 12, the guard ring 16, the top conductive region 30, and the lateral isolation region 24 to have a circular symmetry about the axis H of the photodiode 1.

Present on a peripheral region of the top surface $S_{sup}$, laterally staggered with respect to the top conductive region 30, is a first dielectric region 32, which surrounds the top conductive region 30, with which it is in direct contact.

The first dielectric region 32 further extends on a peripheral portion of the guard ring 16. In addition, the first dielectric region 32 extends over the lateral isolation region 24, with which it is in direct contact.

The photodiode 1 further comprises a top metallization 35, made, for example, of an aluminum, silicon, and copper alloy (AlSiCu). The top metallization 35 extends over a portion of the top conductive region 30, with which it is in direct contact. In use, through the top metallization 35, it is possible to bias the PNI junction.

The photodiode 1 further comprises a second dielectric region 38 of a layered type, which is made, for example, of silicon nitride (Si$_3$N$_4$) and has a thickness of, for example, 200 nm. The second dielectric region 38 extends on the first dielectric region 32, as well as on a central portion of the anode region 12, leaving, however, the top metallization 35 at least in part exposed. Operatively, the second dielectric region 38 functions as passivation, as well as antireflective layer. In this connection, the second dielectric region 38 has a thickness such that it exhibits a high transmittance (for example, of at least 80%) in the ultraviolet (for example, at 290 nm). For this purpose, the thickness of the second dielectric region 38 may, for example, be approximately 170 nm or 230 nm.

The photodiode 1 further comprises a bottom conductive region 40, which extends in contact with the semiconductor body 2, underneath the bottom surface $S_{inf}$, and is made, for example, of nickel silicide. Further, the photodiode 1 comprises a bottom metallization 42, arranged underneath the bottom conductive region 40 and in direct contact with the latter. For example, albeit not shown, the bottom metallization 42 may be formed by a multilayer structure including three layers arranged in succession and made, respectively, of titanium, nickel, and gold.

In practice, the photodiode 1 is such that the avalanche current generated inside it flows in the direction of the axis H. Further, the lateral isolation region 24 enables, thanks to the presence of the conductive isolation region 28, optical isolation of the photodiodes of the array 220. In other words, the lateral isolation region 24 makes it possible to limit the adverse effects on the photodiode 1 induced by photons generated by electroluminescence during the avalanche multiplication process in adjacent photodiodes, this effect being known as "optical crosstalk". Each photodiode of the array 220 is thus optically uncoupled from the other photodiodes.

The photodiode 1 may be obtained using, for example, the method described in what follows and represented in FIGS. 3-29.

Initially, as shown in FIG. 3, the semiconductor body 2 is provided, which includes the substrate 4 and the first, second, and third epitaxial layers 6, 8, 10. Further, albeit not shown, formed in succession on the semiconductor body 2 are the so-called alignment marks, in a per se known manner. In this connection, in order to form the alignment marks it is, for example, possible to deposit a sacrificial layer on the semiconductor body 2 and then etch selective portions of the sacrificial layer and underlying portions of silicon carbide, using a resist mask. Next, the resist and the residual portions of sacrificial layer are removed by carrying out, respectively, a dry etch and a wet etch. In any case, for the purposes of fabrication of the present photodiode, the details regarding creation of the alignment marks are irrelevant.

Next, as shown in FIG. 4, laid on the top surface $S_{sup}$ of the semiconductor body 2 is a first dielectric layer 60, which is obtained, for example, by deposition of TEOS oxide and has, for example, a thickness of 0.8 μm.

Figure 5:
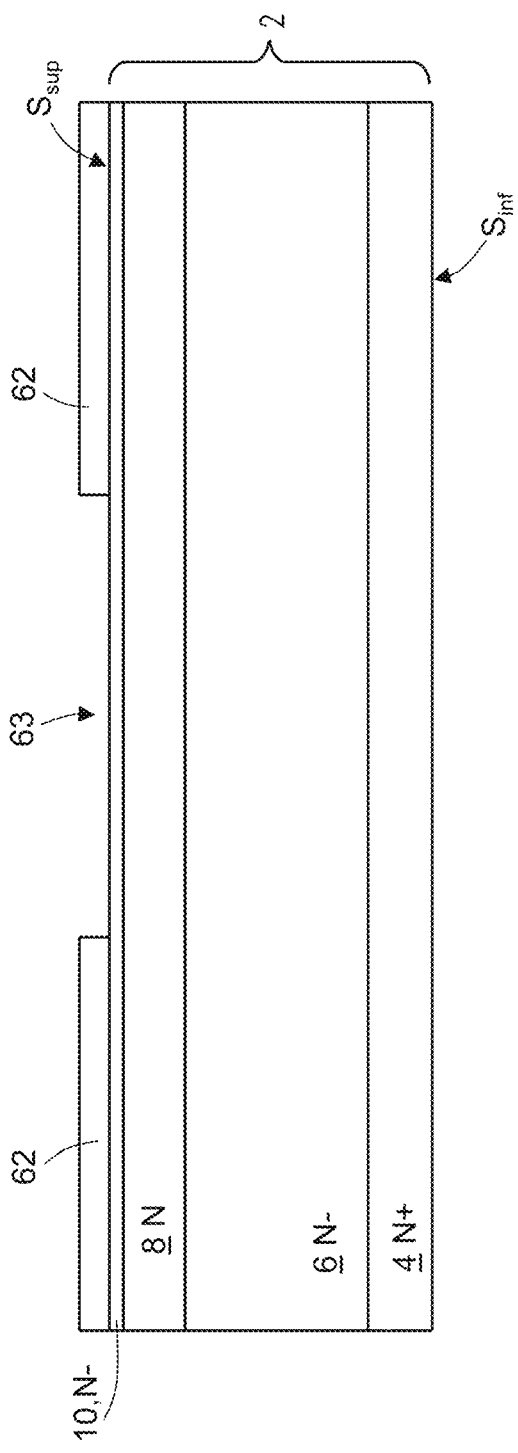

Next, as shown in FIG. 5, a portion of the first dielectric layer 60 is selectively removed for exposing an underlying portion of the third epitaxial layer 10, in which the anode region 12 will be formed. In a per se known manner and consequently not shown in detail, selective removal of the aforementioned portion of the first dielectric layer 60 may be obtained by applying, on the first dielectric layer 60, a corresponding resist layer (not shown), and then carrying out a photolithographic process and a subsequent (dry or wet) etch; the resist layer is then removed. The residual portion of the first dielectric layer 60 forms a first mask 62, which defines a first window 63.

Figure 6:
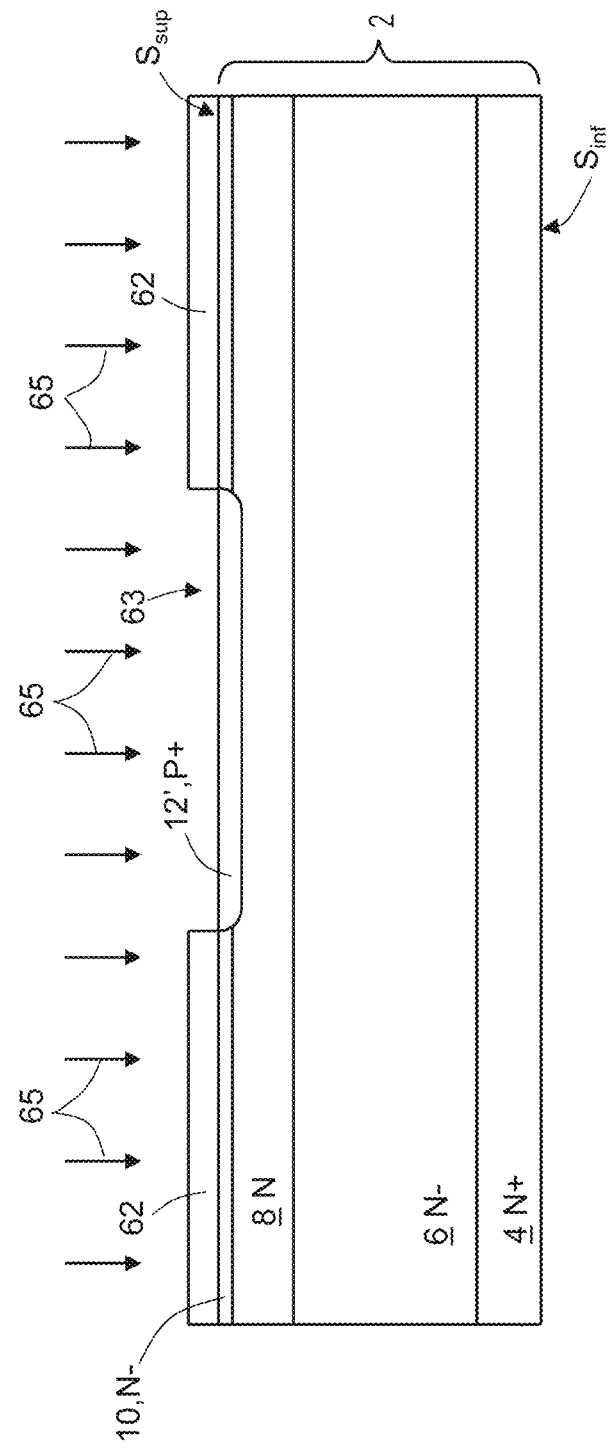

Next, as shown in FIG. 6, through the first window 63 a process of double implantation of dopant species of a P type is carried out (for example, of aluminum ions), represented by the arrows 65, for localizing the dopant species in a first small layer 12', which gives out onto the top surface $S_{sup}$ (in particular, onto the first window 63), traverses the third epitaxial layer 10, and extends into a top portion of the second epitaxial layer 8. In detail, the double implantation is obtained with doses of $5 \cdot 10^{13}$ cm$^{-2}$ (first implant) and $1 \cdot 10^{14}$ cm$^{-2}$ (second implant), with energies of 30 keV (first implant) and 80 keV (second implant), and at a temperature of 500° C.

Next, as shown in FIG. 7, the first mask 62 is removed by a wet etch.

Then, as shown in FIG. 8, formed on the top surface $S_{sup}$ is a polymeric layer 68 (for example, formed by a resist), which has a thickness of, for example, 2.5 μm and contains carbon atoms.

As shown in FIG. 9, the polymeric layer 68 is then subjected to a process of pyrolysis, by carrying out a thermal process at a temperature, for example, of approximately 800° C., for a duration of approximately thirty minutes and in an argon environment. These operations lead to evaporation of the volatile components of the polymeric layer 68 and to consequent formation, by the carbon atoms, of a carbon layer 70.

As shown in FIG. 10, a further thermal process is then carried out for activating the dopant species present in the first small layer 12', as well as for reducing the lattice damage caused by the aforementioned double implantation. This further thermal process is carried out at a temperature, for example, of approximately 1650° C. and has a duration, for example, of approximately thirty minutes. Further, also this further thermal process is carried out in an argon environment. Following upon execution of this further thermal process, the first small layer 12' forms the anode region 12.

For practical purposes, the presence of the carbon layer 70 prevents formation of surface roughness of the semiconductor body 2 during execution of the aforementioned thermal process for activation of the dopant species. Further, the presence of the carbon layer 70 reduces diffusion towards the outside of the dopant species during the aforementioned thermal process.

Figure 11:
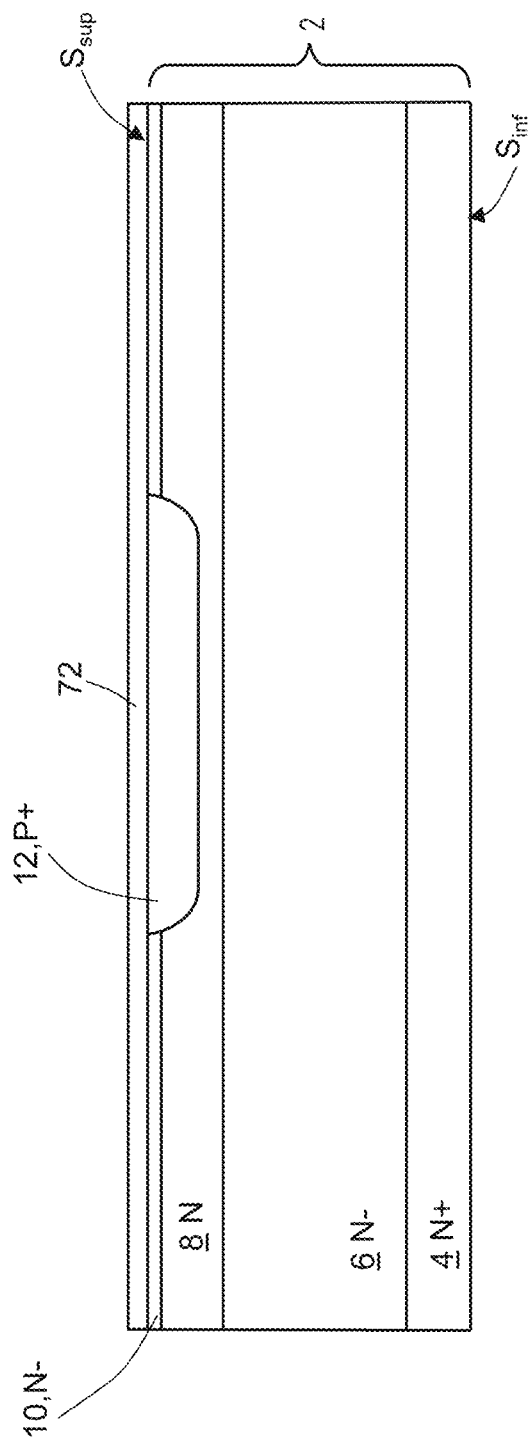

Next, as shown in FIG. 11, a further thermal process is carried out in an oxygen environment, at a temperature, for example, of approximately 900° C., and for a duration, for example, of approximately thirty minutes. This thermal process entails the reaction of the carbon of the carbon layer 70 with oxygen and consequent generation of volatile components, which are dispersed. Consequently, on the top surface $S_{sup}$ an oxidized layer 72 is formed.

Figure 12:
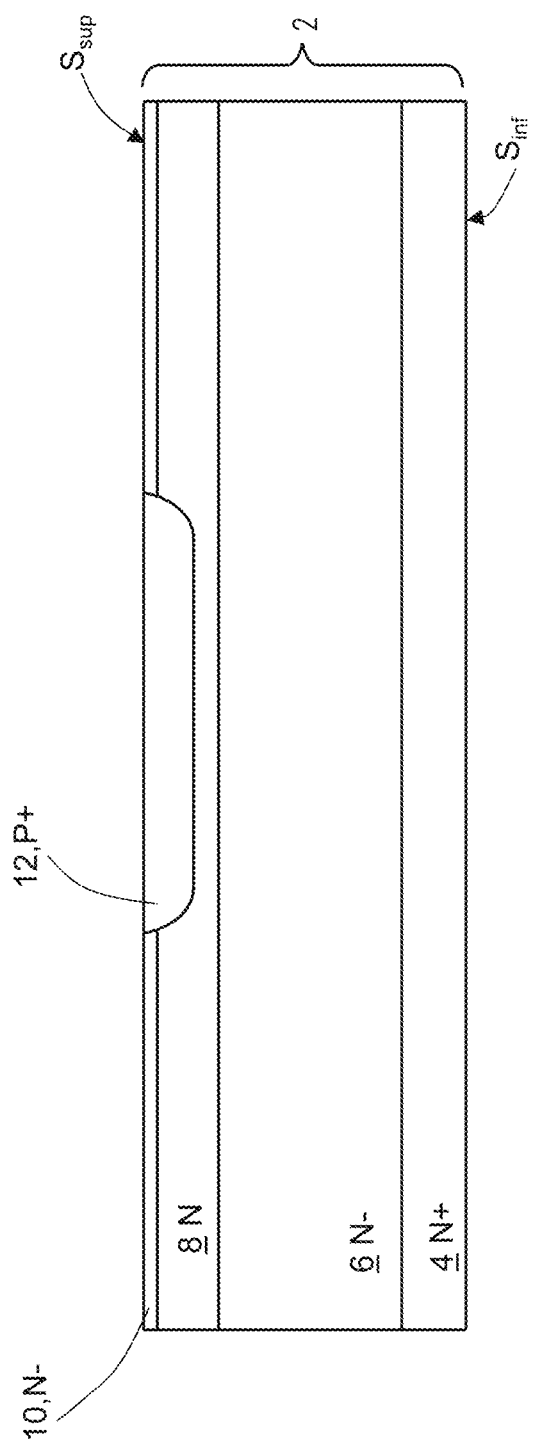

Next, as shown in FIG. 12, the oxidized layer 72 is removed, for example by a wet etch. This wet etch entails also removal of a first thermal-oxide layer (not shown) that has formed on the bottom surface $S_{inf}$ of the semiconductor body 2 during the thermal process described with reference to FIG. 11.

Then, as shown in FIG. 13, laid on the top surface $S_{sup}$ of the semiconductor body 2 is a second dielectric layer 76, which is made, for example, of TEOS oxide and has, for example, a thickness of 0.8 μm.

Next, as shown in FIG. 14, a portion of the second dielectric layer 76 is selectively removed for exposing an underlying portion of the third epitaxial layer 10, which surrounds the anode region 12, and in which the guard ring 16 will be formed. Selective removal of the aforementioned portion of the second dielectric layer 76 may take place by applying, on the second dielectric layer 76, a corresponding resist layer (not shown), and then carrying out a photolithographic process and a subsequent (dry or wet) etch. The resist layer is then removed. The residual portion of the second dielectric layer 76 forms a second mask 77, which defines a second window 79 of an annular shape.

Figure 15:
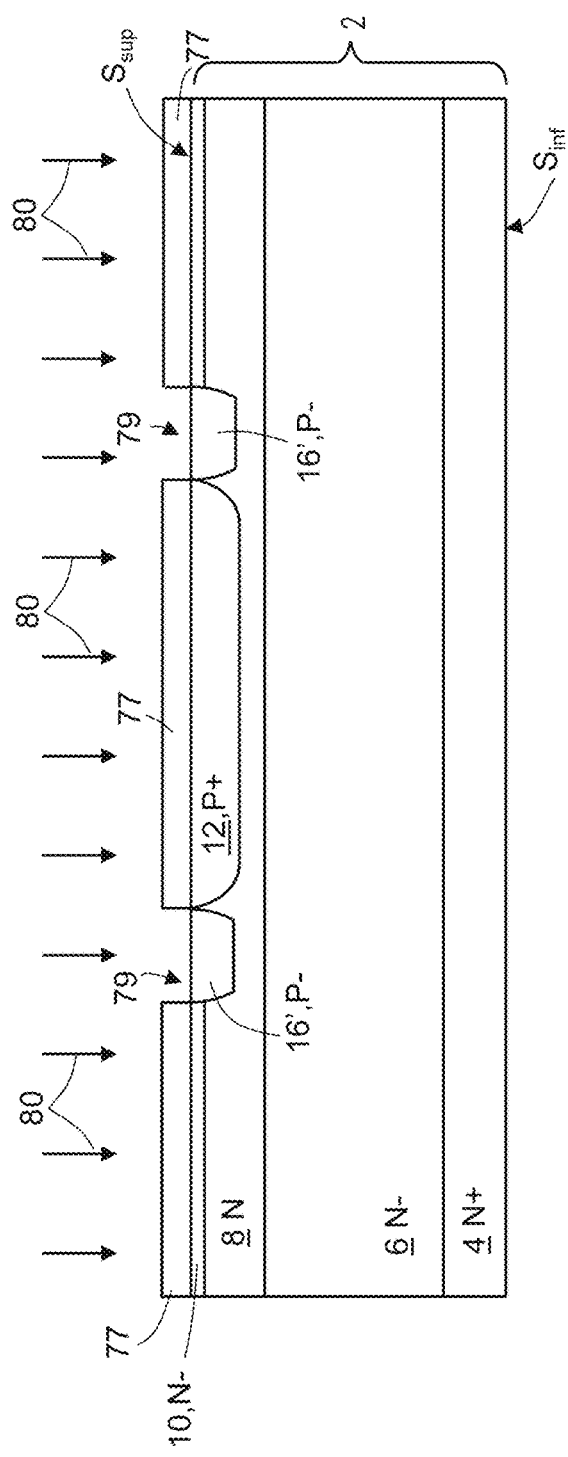

Next, as shown in FIG. 15, through the second window 79 there is carried out a new process of double implantation of dopant species of a P type (for example, boron ions), represented by the arrows 80, for localizing the dopant species in a second small layer 16', which gives out onto the top surface $S_{sup}$ (in particular, onto the second window 79), traverses the third epitaxial layer 10, and extends into a corresponding top portion of the second epitaxial layer 8. In detail, the new double implantation is made with doses of $8 \cdot 10^{14}$ cm$^{-2}$ (first implant) and $1.2 \cdot 10^{15}$ cm$^{-2}$ (second implant), with energies of 30 keV (first implant) and 80 keV (second implant), and at room temperature.

Figure 16:
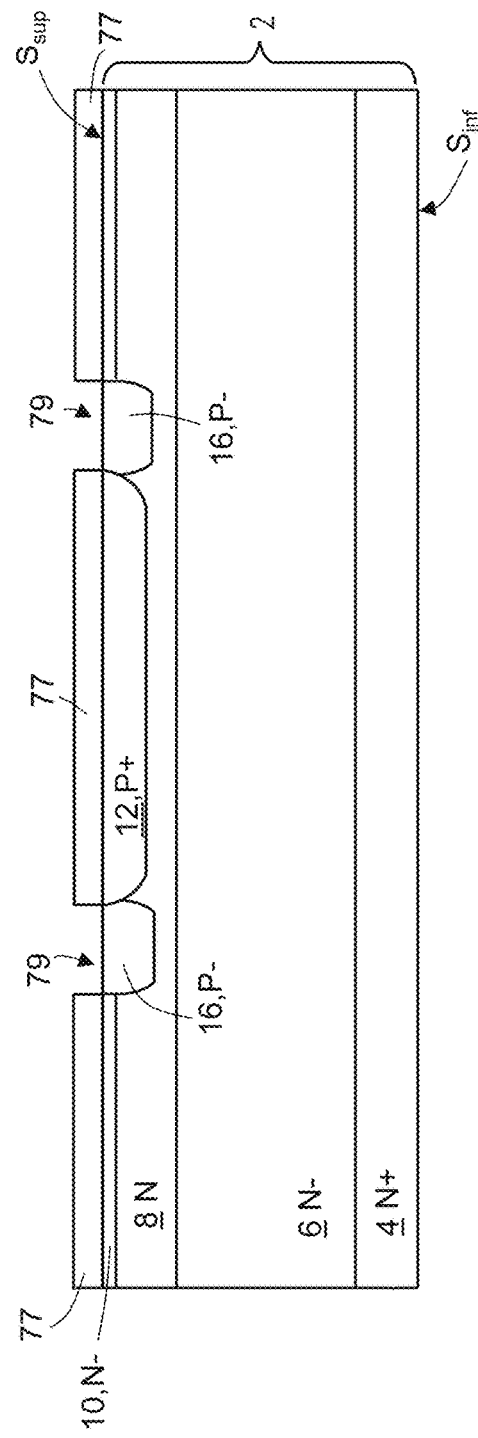

Next, as shown in FIG. 16, a new thermal process is carried out to repair the damage caused by the previous implantation of dopant species in the second small layer 16' and form the guard ring 16. This thermal process is performed at a temperature, for example, of approximately 1050° C. and for a duration, for example, of approximately ninety minutes, in an oxygen environment. Further, this process may not entail complete activation of the dopant species present in the second small layer 16'; in this case, the guard ring 16 forms in any event a high-resistivity well.

Next, as shown in FIG. 17, the second mask 77 is removed by a wet etch. This wet etch also entails removal of a second layer of thermal oxide (not shown) that has formed on the bottom surface $S_{inf}$ of the semiconductor body 2 during the thermal process described with reference to FIG. 16.

Next, as shown in FIG. 18, formed on the top surface $S_{sup}$ is a protective layer 82, which is made, for example, of TEOS oxide or resist and has a thickness of, for example, 0.8 µm. In addition, formed for example by sputtering underneath the bottom surface $S_{inf}$ is a nickel layer 84, which will be referred in what follows as the bottom layer 84.

Figure 19:
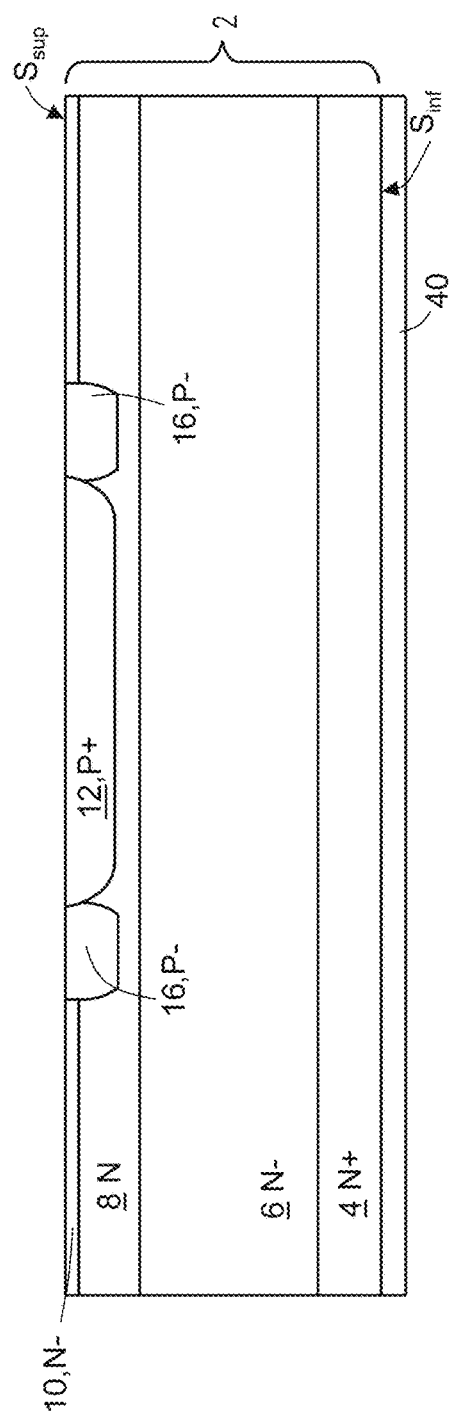

Next, the protective layer 82 is removed and a silicidation process is then carried out, which envisages annealing for a duration of sixty seconds, at a temperature of, for example, 1000° C., and in a nitrogen environment. As shown in FIG. 19, at the end of the silicidation process, underneath the bottom surface $S_{inf}$, the bottom conductive region 40 is present, which has a thickness of, for example, 400 nm.

Figure 20:
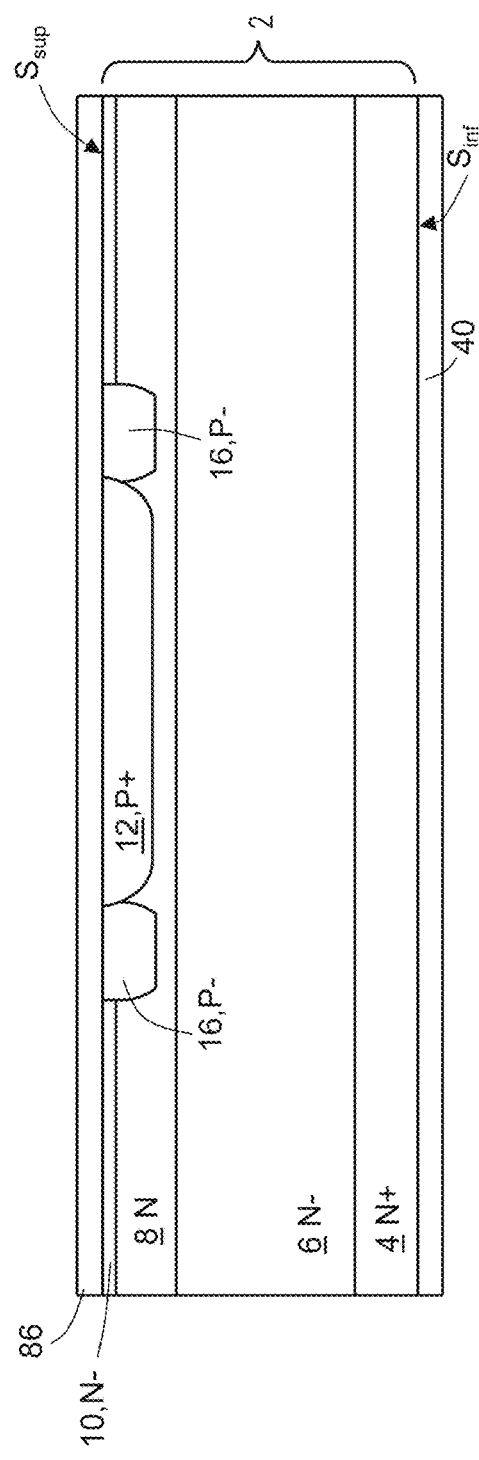

Then, as shown in FIG. 20, formed on the top surface $S_{sup}$ is a third dielectric layer 86. For example, the third dielectric layer 86 is obtained by deposition of TEOS oxide and has a thickness of 0.4 µm.

Next, as shown in FIG. 21, formed on the third dielectric layer 86 is a third mask 88, formed, for example, by a corresponding resist layer patterned via a photolithographic process. The third mask 88 leaves exposed an annular portion of the third dielectric layer 86, which gives out onto a third window 90 defined by the third mask 88.

Next, as shown in FIG. 22, a dry etch is carried out, which enables selective removal of a portion of the third dielectric layer 86 that gives out onto the third window 90 and an underlying portion of semiconductor body 2 for forming the trench 25.

Then, the third mask 88 is removed. Next, as shown in FIG. 23, formed in succession by sputtering are three layers 127a, 127b, 128, which will be referred to in what follows as the first, second, and third coating layers 127a, 127b and 128.

In detail, the first coating layer 127a is made of titanium and has a thickness of, for example, 45 nm; further, the first coating layer 127a coats the side walls and the bottom wall of the trench 25, as well as the third dielectric layer 86. The second coating layer 127b is made of titanium nitride, has a thickness of, for example, 70 nm and coats the first coating layer 127a. Finally, the third coating layer 128 is made of tungsten and coats the second coating layer 127b for filling the trench 25.

Next, as shown in FIG. 24, the portions of the first, second, and third coating layers 127a, 127b, 128 arranged on the third dielectric layer 86 are removed via a dry etch. In this way, the remaining portions of the first, second, and third coating layers 127a, 127b, 128 form, respectively, the thin coating layer 27a, the thick coating layer 27b, and the conductive isolation region 28.

Next, albeit not shown, it is possible to carry out so-called planarization operations of a per se known type and not described in detail, in so far as it is irrelevant for the purposes of the present photodiode. For example, these planarization operations may comprise deposition, on the third dielectric layer 86, of further TEOS oxide, as well as subsequent deposition of spin on glass (SOG), hardening of the spin on glass deposited, and, finally, grinding.

Next, as shown in FIG. 25, formed on the top surface $S_{sup}$ is a fourth dielectric layer 100, which includes the third dielectric layer 86 (or, in the case of execution of the planarization operations, what remains of that layer), as well as further TEOS oxide obtained by deposition. The fourth dielectric layer 100 has, for example, a thickness of 1 µm.

Next, as shown in FIG. 26, a portion of the fourth dielectric layer 100 is selectively removed so that the residual portion of the fourth dielectric layer 100 forms the first dielectric region 32. Selective removal of the aforementioned portion of the fourth dielectric layer 100 may be obtained by applying, on the fourth dielectric layer 100, a corresponding resist layer (not shown), and then carrying out a photolithographic process and a subsequent wet etch. The resist layer is then removed.

Next, as shown in FIG. 27, on the first dielectric region 32 and on the exposed portion of semiconductor material, i.e., on the guard ring 16 and on the anode region 12, a nickel layer 102, which will be referred to in what follows as the top layer 102, is deposited by sputtering. For example, the top layer 102 has a thickness of 100 nm.

Next, as shown in FIG. 28, a portion of the top layer 102 is selectively removed. Selective removal of the aforementioned portion of the top layer 102 may be obtained by applying, on the top layer 102, a corresponding resist layer (not shown), and then carrying out a photolithographic process and a subsequent wet etch; the resist layer is then removed. The residual portion of the top layer 102 forms a region 104, which will be referred to in what follows as the silicided region 104.

Next, as shown in FIG. 29, a silicidation process is carried out, which envisages annealing for a duration of sixty seconds, at a temperature of, for example, 750° C. in a nitrogen environment. Following upon this silicidation process, the silicided region 104 forms the top conductive region 30, which has a thickness of, for example, 200 nm.

In a per se known manner and consequently not shown, there are subsequently formed, in succession, the top metallization 35, the second dielectric region 38, and the bottom metallization 42.

According to a variant of the manufacturing process described previously, following upon the operations described with reference to FIG. 6, i.e., following upon formation of the first small layer 12', it is possible to carry out the operations listed below.

In detail, as shown in FIG. 30, the first mask 62 is removed, and subsequently on the top surface $S_{sup}$ the second mask 77 is formed. In addition, through the second window 79 an implantation of aluminum ions is carried out, represented by the arrows 110, for localizing the dopant species in the second small layer, here designated by 16". In detail, the implantation is made with a dose of $5 \cdot 10^{13}$ cm$^{-2}$ and with an energy of 140 keV.

Figure 31:
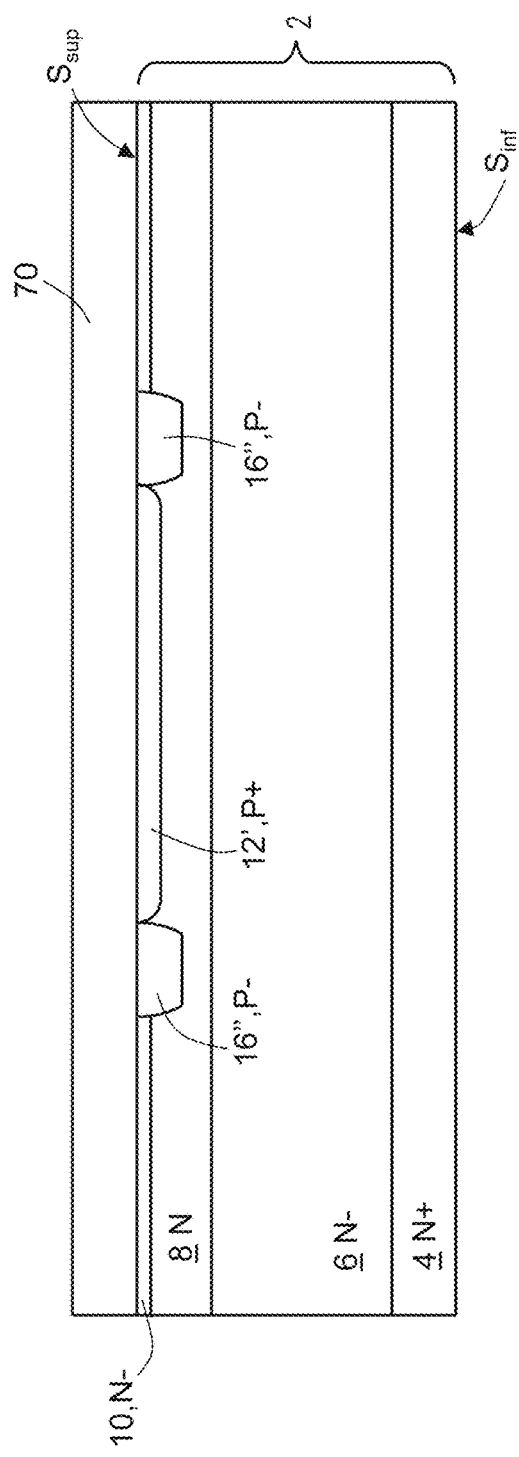

Next, as shown in FIG. 31, the second mask 77 is removed, and formed on the top surface $S_{sup}$ is the carbon layer 70, obtained by formation and subsequent pyrolysis of the polymeric layer 68. For example, the carbon layer may be formed with a thermal process at a temperature, for example, of approximately 800° C., for a duration of approximately thirty minutes in an argon environment.

Figure 32:
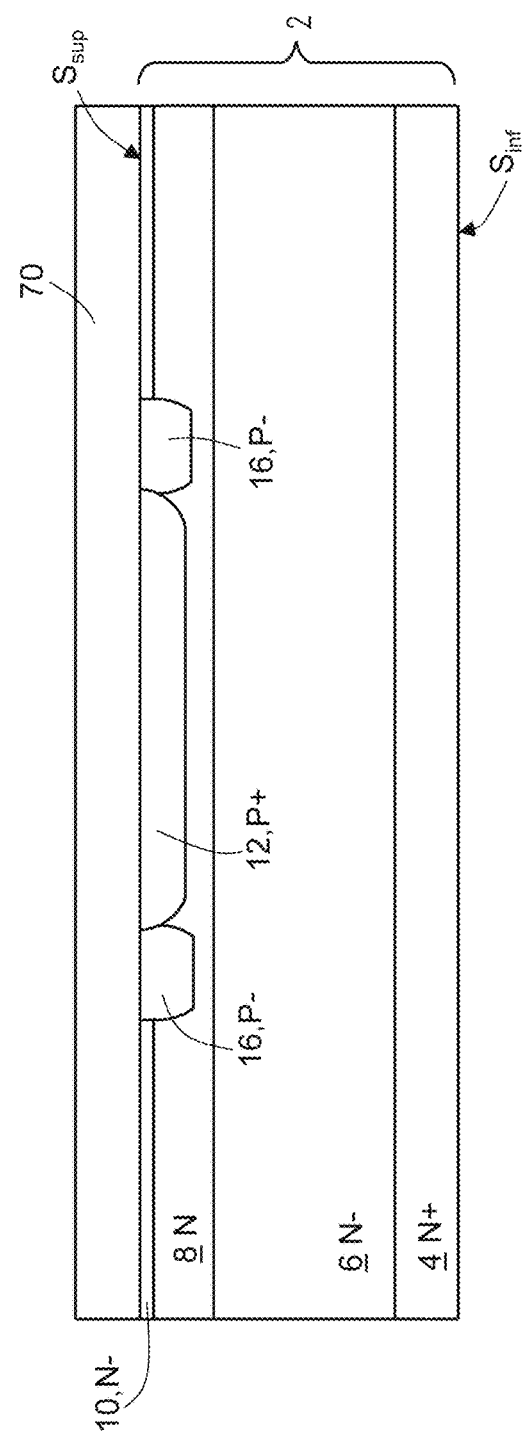

Next, as shown in FIG. 32, a further thermal process is carried out for activating the dopant species present in the first small layer 12' and in the second small layer 16", as well as for reducing the lattice damage caused by the implantations. This further thermal process is carried out at a temperature, for example, of approximately 1650° C. and has a duration, for example, of approximately thirty minutes. Further, also this further thermal process is carried out in an argon environment. Following upon this further thermal process, the first small layer 12' and the second small layer 16" form the anode region 12 and the guard ring 16, respectively.

Next, the carbon layer 70 is removed as described previously, by oxidation. Then, the operations described previously with reference to FIGS. 18-29 are carried out.

Figure 33:
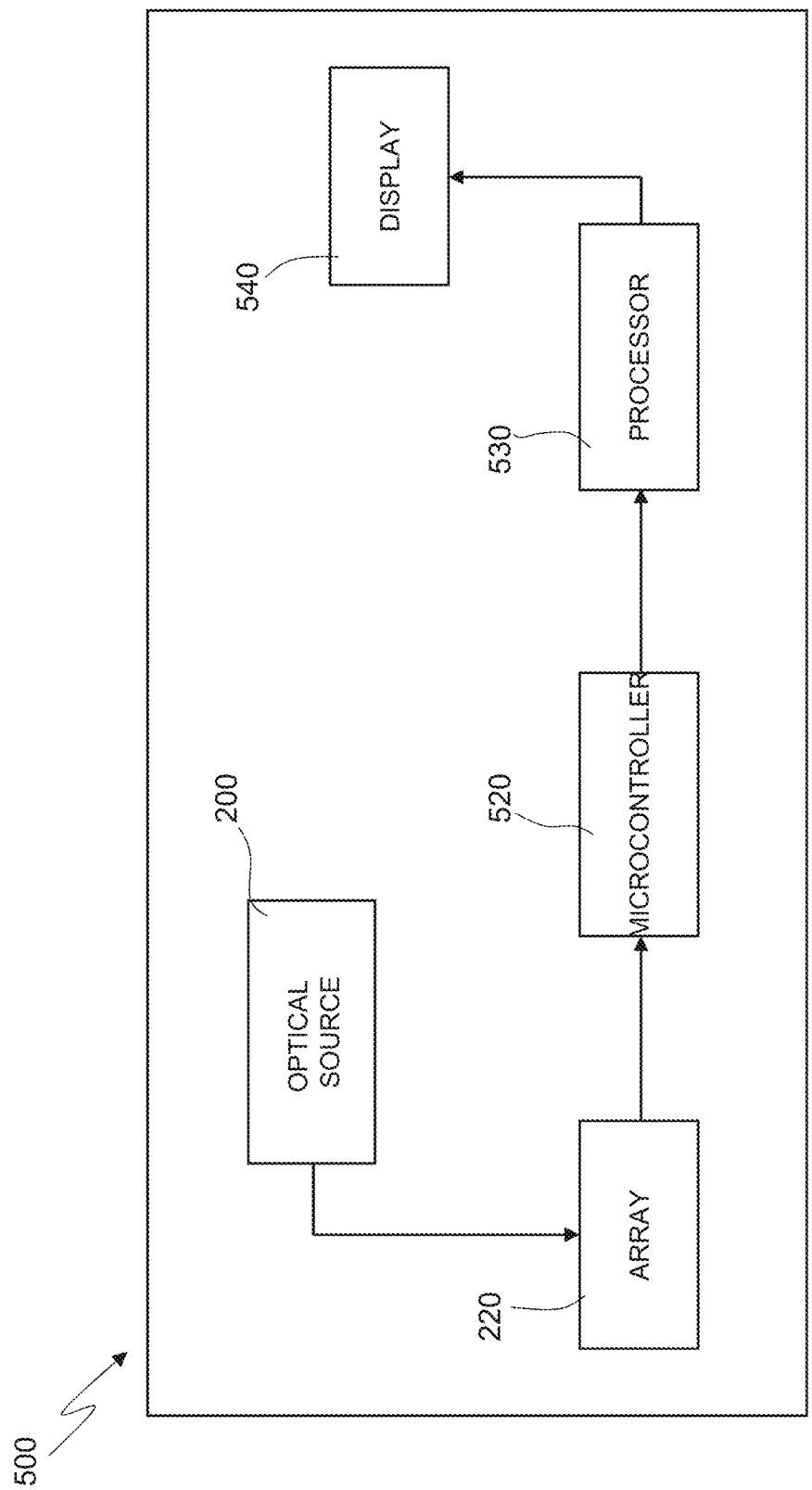
FIG. 33 shows a block diagram of a system including a photodiode array.

Irrespective of the details regarding the manufacturing process, the photodiode array 220 may be used, as shown in FIG. 33, in a generic system 500, in which the array 220 is connected to a microcontroller 520, which is in turn connected to a processor 530 that controls a display 540. The microcontroller 520 processes the output signal of the array 220 and supplies a processed signal to the processor 530, which enables analysis of this processed signal and display of the information associated to said processed signal on the display 540.

The advantages that the present silicon carbide photodiode affords emerge clearly from the foregoing description. In particular, since the lateral confinement of the electrical field is obtained by the guard ring 16, instead of by a mesa structure, it is possible to implement a receiver having a high fill factor and a reduced dead area, and thus an improved optical response. Further, since the photodiode 1 forms a PNI junction, instead of a PIN junction, it is characterized by a relatively low breakdown voltage (for example, lower, in modulus, than 100 V), which facilitates, for example, its use in Geiger mode. In this connection, the photodiode 1 may in actual fact function as a so-called "Geiger-mode avalanche photodiode" (GM-APD), also known as "single-photon avalanche diode" (SPAD). For this purpose, the photodiode 1 is biased at a reverse voltage higher, in modulus, than the breakdown voltage. In this way, generation of a single electron-hole pair, following upon absorption of a photon incident on the photodiode 1, is sufficient to trigger an ionization process that causes avalanche multiplication of the carriers, with gains of around $10^6$ and consequent generation in a short time (hundreds of picoseconds) of the avalanche current. This avalanche current may be appropriately collected, typically by an external circuitry connected to the PNI junction, for example through the top metallization 35 and the bottom metallization 42, and represents an output signal of the photodiode 1.

In addition, the presence of the first epitaxial layer 6 guarantees a good absorption of the photons also underneath the PN junction formed by the anode region 12 and by the second epitaxial layer 8.

Since the anode region 12 has a particularly small thickness, the photodiode 1 further has a high sensitivity in regard to radiation having a short wavelength, given that the junction is very close to the top surface $S_{sup}$ and ultraviolet radiation has a low capacity of penetration into the semiconductor body 2. In this connection, the thickness of the anode region 12 is small, and the doping has a good uniformity thanks to the fact that the anode region 12 is obtained by implantation.

Finally, it is clear that modifications and variations may be made to the photodiode and to the manufacturing process described, without thereby departing from the scope of the present disclosure.

For example, the types of conductivity may be reversed with respect to what has been described. In this connection, however, the adoption of a structure of a type P on N (as in the embodiment shown in FIG. 1) makes it possible to benefit from the fact that in silicon carbide the rate of ionization by impact of holes is greater than the rate of ionization by impact of electrons.

Further possible are embodiments without the third epitaxial layer 10, the function of which is to facilitate inversion of the doping type in at least one portion of the semiconductor body, which is to form the anode region 12.

As regards, instead, the first epitaxial layer 6, it may be made of intrinsic silicon carbide.

As regards the lateral isolation region 24, it is optional and may thus be absent, for example in the case where a single photodiode is present.

As regards the lateral coating region 27, it may be formed by a single coating layer, or in any case be formed by a succession of layers different from what has been described.

As regards the trench 25, it may have a shape different from the one described; for example, the trench 25 may have a depth different from the one described and may thus extend, for example, also through part of the substrate 4, or else may extend, for example, so as not to pass entirely through the first epitaxial layer 6.

As regards the top metallization 35, it may be formed (for example) by two respective layers, the first of which is made of titanium, and the second of which is made of an alloy of aluminum, silicon, and copper.

As regards the conductive isolation region 28, it may be made of materials different from what has been described and may further include in turn a plurality of subregions. For example, the conductive isolation region may include a tungsten core, which is coated by a respective titanium layer; in this case, the lateral isolation region 24 is formed, proceeding from outside towards the inside, by the thin coating layer 27a, by the thick coating layer 27b, by the titanium layer of the conductive isolation region and by the tungsten core of the conductive isolation region.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An avalanche photodiode for detecting ultraviolet radiation, comprising:
   a semiconductor body having a front surface and including:
      a silicon carbide substrate having a first type of conductivity;
      a first epitaxial layer including silicon carbide and positioned on the silicon carbide substrate;
      a second epitaxial layer including silicon carbide, positioned on the first epitaxial layer, and having the first type of conductivity, at least a portion of the second epitaxial layer being a cathode region; and
      a third epitaxial layer including silicon carbide and positioned on the second epitaxial layer;
   an anode region extending completely through the third epitaxial layer and having a second type of conductivity; and
   a guard ring having the second type of conductivity, which extends into the semiconductor body starting from the front surface and completely laterally surrounds the anode region.

2. The photodiode according to claim 1, wherein the guard ring has a doping level lower than a doping level of the anode region.

3. The photodiode according to claim 1, wherein the anode region has a thickness comprised between 0.05 μm and 0.25 μm.

4. The photodiode according to claim 1, wherein the third epitaxial layer is in direct contact with the second epitaxial layer.

5. The photodiode according to claim 1, wherein the first epitaxial layer has a doping level not higher than $1 \cdot 10^{15}$ cm$^{-3}$.

6. The photodiode according to claim 1, further comprising:
a trench which extends through the semiconductor body starting from the front surface and completely laterally surrounds the guard ring; and
a conductive region extending within the trench.

7. The photodiode according to claim 1, further comprising:
an antireflective structure which extends in contact with the anode region and has a transmittance at 290 nm of at least 80%.

8. A photodiode array comprising:
a semiconductor body having a front surface and including:
a silicon carbide substrate having a first type of conductivity;
a first epitaxial layer including silicon carbide and positioned on the silicon carbide substrate;
a second epitaxial layer including silicon carbide, positioned on the first epitaxial layer, and having the first type of conductivity; and
a third epitaxial layer including silicon carbide and positioned on the second epitaxial layer;
a plurality of avalanche photodiodes formed in the semiconductor body, each avalanche photodiode including:
a cathode region formed in at least a portion of the second epitaxial layer;
an anode region extending completely through the third epitaxial layer and having a second type of conductivity; and
a guard ring having the second type of conductivity, which extends into the semiconductor body starting from the front surface and completely laterally surrounds the anode region.

9. The photodiode array according to claim 8, wherein the guard ring has a doping level lower than a doping level of the anode region.

10. The photodiode array according to claim 8, wherein the third epitaxial layer is in direct contact with the second epitaxial layer.

11. The photodiode array according to claim 8, further comprising:
a trench which extends through the semiconductor body starting from the front surface and completely laterally surrounds the guard ring; and
a conductive region extending within the trench.

12. A system for detecting ultraviolet radiation, comprising:
a processing unit; and
a photodiode array coupled to said processing unit and including:
a semiconductor body having a front surface and including:
a silicon carbide substrate having a first type of conductivity;
a first epitaxial layer including silicon carbide and positioned on the silicon carbide substrate;
a second epitaxial layer including silicon carbide, positioned on the first epitaxial layer, and having the first type of conductivity; and
a third epitaxial layer including silicon carbide and positioned on the second epitaxial layer;
a plurality of avalanche photodiodes formed in the semiconductor body, each avalanche photodiode including:
a cathode region formed in at least a portion of the second epitaxial layer;
an anode region extending completely through the third epitaxial layer and having a second type of conductivity; and
a guard ring having the second type of conductivity, which extends into the semiconductor body starting from the front surface and completely laterally surrounds the anode region.

13. The system according to claim 12, wherein the guard ring has a doping level lower than a doping level of the anode region.

14. The system according to claim 12, wherein the third epitaxial layer is in direct contact with the second epitaxial layer.

15. The system according to claim 12, wherein the photodiode array includes:
a trench which extends through the semiconductor body starting from the front surface and completely laterally surrounds the guard ring; and
a conductive region extending within the trench.

16. A method, comprising:
forming a semiconductor body having a front surface, the forming including:
forming a first epitaxial layer on a silicon carbide substrate having a first type of conductivity, the first epitaxial layer including silicon carbide;
forming a second epitaxial layer on the first epitaxial layer, the second epitaxial layer including silicon carbide and having the first type of conductivity, at least a portion of the second epitaxial layer being a cathode region;
forming a third epitaxial layer on the second epitaxial layer, the third epitaxial layer including silicon carbide;
forming an anode region having a second type of conductivity, which extends through the third epitaxial layer and into the second epitaxial layer; and
forming a guard ring having the second type of conductivity, which extends through the third epitaxial layer and into the second epitaxial layer and completely laterally surrounds the anode region.

17. The method according to claim 16, wherein forming the anode region comprises:
forming a first implanted region by carrying out a first selective implantation of dopant ion species having the second type of conductivity within the semiconductor body; and
carrying out a first thermal treatment on the first implanted region.

18. The method according to claim 17, wherein forming the anode region further comprises forming on the front surface a carbon layer after carrying out said first selective implantation and before carrying out said first thermal treatment.

19. The method according to claim 17, wherein forming the guard ring comprises:
after forming the anode region, forming a second implanted region by carrying out a second selective implantation of dopant ion species having the second type of conductivity within the semiconductor body; and
carrying out a second thermal treatment of the second implanted region.

20. The method according to claim 17, wherein forming the guard ring comprises:
after forming the first implanted region and before carrying out the first thermal treatment, forming a second implanted region by carrying out a second selective implantation of dopant ion species having the second type of conductivity within the semiconductor body.

21. The method according to claim 20, further comprising forming on the front surface a carbon layer, after carrying out said first and second selective implantations and before carrying out said first thermal treatment.

22. The method according to claim 16, wherein forming the anode region includes implanting dopant ion species, having the second type of conductivity, through the third epitaxial layer, and forming the guard includes, after forming the anode region, implanting dopant ion species, having the second type of conductivity, through the third epitaxial layer.

23. The method according to claim 16, further comprising:
   etching, within the semiconductor body, a trench; and
   forming, within the trench, a conductive region.

24. The method according to claim 16, further comprising forming on the anode region an antireflective structure with a transmittance at 290 nm of at least 80%.

* * * * *